United States Patent [19]

Nishizawa et al.

[11] Patent Number: 5,552,623
[45] Date of Patent: Sep. 3, 1996

[54] SHORT CHANNEL MOSFET WITH BURIED ANTI-PUNCH THROUGH REGION

[75] Inventors: Jun-ichi Nishizawa; Tadahiro Ohmi, both of Sendai, Japan

[73] Assignee: Handotai Kenkyu Shinkokai, Sendai, Japan

[21] Appl. No.: 134,010

[22] Filed: Oct. 12, 1993

Related U.S. Application Data

[63] Continuation of Ser. No. 62,333, Jun. 9, 1987, Pat. No. 5,384,476, which is a continuation of Ser. No. 179,782, Aug. 20, 1980, abandoned.

[30] Foreign Application Priority Data

Aug. 25, 1979 [JP] Japan .................... 54-108377
Sep. 7, 1979 [JP] Japan .................... 54-115491

[51] Int. Cl.⁶ ................................ H01L 27/108
[52] U.S. Cl. .................. 257/345; 257/297; 257/407
[58] Field of Search ............... 257/407, 297, 257/345

[56] References Cited

U.S. PATENT DOCUMENTS

| | | | |
|---|---|---|---|
| 3,673,471 | 6/1972 | Klein et al. | 357/59 |
| 4,247,862 | 1/1981 | Klein et al. | 357/23 C |
| 4,329,706 | 5/1982 | Crowder et al. | 357/235 |
| 4,334,235 | 6/1982 | Nishizawa | 357/41 |
| 5,384,476 | 1/1995 | Nishizawa et al. | 257/296 |

FOREIGN PATENT DOCUMENTS

| | | | |
|---|---|---|---|
| 53-80172 | 7/1978 | Japan | 257/23 R |
| 53-84571 | 7/1978 | Japan | 257/23 R |
| 53-141585 | 12/1978 | Japan | 257/23 D |

OTHER PUBLICATIONS

Konaka et al, Japan J. Appl. Phys Suppl. 18–1, 1979, pp. 27–33.
Nishiuchi et al, IEEE IEDM, Tech Digest, Dec. 1978, pp. 26–29.
Dennard et al IEEE J. of Solid State Circuits, vol. SC 9 No. 5 Oct. 1974, pp. 256–267.
Tasch Jr. et al, IEEE Trans on Electron Dev, vol. ED 25 No. 1. Jan. 1978 pp. 38–41.

*Primary Examiner*—William D. Larkins
*Attorney, Agent, or Firm*—Cushman Darby & Cushman, LLP

[57] ABSTRACT

A semiconductor device having a source region, a drain region and a channel region which are formed in a surface portion of a semiconductor substrate, and a gate formed with a material having a relatively high built-in voltage relative to the source region. This semiconductor device may further include, in the semiconductor substrate to extend along the channel region, a highly-doped region having a conductivity type opposite to that of the source region. This highly-closed region may have an impurity concentration gradient which is greater toward its portion facing the abovesaid surface of the substrate. These arrangements serve to prevent extinction of memory due to current leakage during absence of bias voltage which otherwise would develop in semiconductor devices having short-channel and thin gate oxide layer, and due to irradiation of alpha-particle onto the device.

7 Claims, 18 Drawing Sheets

SHORT CHANNEL MOSFET WITH BURIED ANTI-PUNCH THROUGH REGION

This is a continuation of Ser. No. 07/062,333, filed Jun. 9, 1987, now U.S. Pat. No. 5,384,476, which was a Continuation of Ser. No. 06/179,782, filed Aug. 20, 1980, now abandoned.

BACKGROUND OF THE INVENTION

Field of the Invention

The present invention relates to a semiconductor device, and more particularly to a semiconductor device such as an insulation-gate transistor which allows a high packing density integration and effects a good holding of memory contents and which does not make soft errors induced by alpha-particle irradiation. Also, the invention concerns such semiconductor devices serving as a semi-conductor memory and a logic circuitry.

A remarkable development is under way in the field of high packing density integration of semiconductor memories, especially in the field of dynamic random access memory (hereinafter to be referred to as d-RAM) which refreshes its memory contents at certain time intervals. Recently, there have been placed on the market 64 kilo-bit d-RAMs, and development of 256 kilo-bit d-RAMs is under way. High packing density integration of d-RAMs those circuit arrangement has gone to such an extreme end as will not be simplified easily any further than the "one transistor-one capacitor" type is attained only by making the sizes of the respective structural components extremely fine. Such a trend of development has given rise to the tendency for progressively shortening the distance between the source region and the drain region (hereinafter to be referred to as the channel length) in insulation-gate transistors (hereinafter to be referred to as MOS transistors). However, in case the channel length of such transistors is reduced, there arises the inconvenience that, even when the gate potential of the transistor is zero-biased in order to render the transistor non-conductive, there flows a leakage current between the source region and the drain region so that the memory contents will become extinguished in a very short period of time, and the device will not operate to serve as a memory.

In the currently practiced process of making LSI devices using silicon, it is often the case to arrange a MOS field effect transistor (hereinafter to be referred to as MOS-FET) which is a component of the LSI, in such way as mentioned in FIG. 1. In order to cause a high-speed operation, this MOS-FET is formed to have an n-channel structure. In FIG. 1 which represents a prior art device; a p type region 11 represents a substrate. Also, two main electrodes are provided in a symmetrical pattern, so that an $n^+$ type region 12 represents, for example, a source region, and an $n^+$ type region 13 represents, for example, a drain region. Numeral 14 represents a gate region serving as a controlling electrode which is comprised of an $n^+$ type polysilicon, and which is formed by relying on a known usual process of manufacture. It should be understood that this $n^+$ type polysilicon gate region may be substituted by a metal gate region such as aluminum, molybdenum and tungsten. Numeral 15 represents a gate oxide film, 16 a field oxide film, and 17 a PSG film. Numerals 12a and 13a represent a source electrode and a drain electrode, respectively, which are made of a metal such as aluminum. Numeral 18 represents a $p^+$ type region which serves as a channel-stopper region for inhibiting the tendency of formation of a current channel between the field oxide film 16 and p type substrate 11. It should be understood here that the gate oxide film 15 and like films can locally contain a $Si_3N_4$ film Also, it is usual to provide a passivation film on the surface of the device shown in FIG. 1.

By using the MOS-FET having basically the arrangement as shown in FIG. 1, there may be formed a d-RAM cell, for example, the following two types of arrangements. Instead of providing an electrode directly on one of the two main electrode regions, for example, on the drain region 13 of this MOS-FET, there may be provided thereon an insulating film made of $SiO_2$, and an electrode is provided via this insulating film. Alternatively, there may be provided an $n^+$ type polysilicon layer on the drain region 13, and the surface of this polysilicon layer is oxidized for a very small distance to provide a thin oxide film ($SiO_2$), and an electrode is provided on this oxide film. The former arrangement is such that a capacitor, i.e. a storage capacitor, is formed by the $n^+$ type region 13, the insulating oxide film and the electrode 13a. The latter arrangement is such that a capacitor or a storage capacitor is formed by the electrode 13a, the oxide film and the $n^+$ type polysilicon layer. Such arrangements each serves as a d-RAM cell comprising one transistor and one capacitor.

Experimental samples are made for two kinds of substrates and gate oxide films having two kinds of thicknesses $T_{ox}$, using the same manufacturing parameters excepting the channel length L (mask level). The memory retention characteristics of these samples are evaluated, and the result is described hereinbelow. The source region 12 and the drain region 13 are formed by ion-implantation of arsenic (As, implantation voltage: 100 kV, dose: $1\times10^{15}$ cm$^{-2}$) to a depth of $X_j$ of about 0.5 µm. Also, there is given a channel doping with boron (B, implantation voltage: 30 kV, dose: $3\times10^{11}$ cm$^{-2}$). The gate width is set at 100 µm for each sample, and the thickness $T_{ox}$ of gate oxide film is set at 500Å and 1000Å, respectively, and the resistivity $\rho_{sub}$ of the p type substrate 11 is set at about 7Ωcm and about 20Ωcm, respectively.

By the use of a circuit arrangement of the above-mentioned d-RAM having a terminal of its storage capacitor $C_s$ grounded as shown in FIG. 2, its memory retention characteristic is evaluated.

In FIG. 2, reference numeral 21 represents a word line, and 22 a bit line. Numeral 23 represents a MOS-FET $T_1$, and 24 a storage capacitor $C_s$. To effect "write-in", a write-in voltage $V_w$ is applied to the bit line 22, while a voltage $V_G$ is applied to the word line 21. In case this MOS-FET $T_1$ is an n-channel type these voltages $V_w$ and $V_G$ are positive voltages, respectively. When a positive voltage $V_w$ is applied to the bit line 22, it should be understood that when the MOS-FET $T_1$ is rendered conductive by the application of a positive voltage $V_G$ capacitor $C_s$, and this storage capacitor $C_s$ is charged to the word line 21, there flows a current to the storage to a value represented substantially by $V_w-V_{th}$, wherein $V_{th}$ represents a threshold voltage of the MOS-FET $T_1$. In this state of the FET, electrons are allowed to flow out from the $n^+$ type drain region 13 which serves as an electrode of storage capacitor $C_s$, so that this region 13 is positively charged due to shortage of electrons therein. Then, the voltage $V_G$ of the word line 21 is set back to zero, and thereafter the voltage $V_w$ of the bit line 22 is removed. Whereupon, the write-in operation is completed. In the state that the memory contents are being retained, there is no need to apply an external voltage to any one of the terminals of the memory cell having the circuit arrangement of FIG. 2. As stated above, in this memory content holding state, the $n^+$ type region 13 is short of electrons and is charged positive, and this n+ type region 13 is reverse biased relative to the p type substrate 11. This storing mode is called an electron-depletion storing mode. Accordingly, the contents of memory will be preserved for an extended period of time. The memory retention time in the electron-depletion storing mode is always longer than that in the electron-accumulation storing mode where the amount of excess electrons is stored in the n+ type storage region.

Although the biasing of the p type substrate 11 of the MOS-FET $T_1$ has not been described with respect to FIG. 2, in case there is the fear that the contents of memory would become extinguished due to a sub-threshold current attributable to a shortened length of the effective channel of the MOS-FET $T_1$, there is applied a substrate bias voltage, which is a negative voltage in this example, to prevent such extinguishment of the memory contents.

The memory content holding characteristic is measured in the manner as stated above. Such characteristic for three different samples is shown in FIGS. 3, 4 and 5, respectively. These data are observed in a d-RAM cell operating at room temperature. The applied voltages are: $V_G$=5V, and $V_w$=5V. The memory holding time means a period of time starting from the time at which the word line voltage is returned to zero up to the time when the voltage stored in the storage capacitor $C_s$ has dropped to about ½. The memory holding time is plotted as a function of the effective channel length $L_{eff}$. This $L_{eff}$ should be noted to be shorter by about 0.5 µm as compared with the channel length at mask level. In FIG. 3, marks ①, ②, ③ and ④ correspond to the substrate bias voltage of 0V, –1V, –2V and –4V, respectively. FIG. 3 shows the result of the sample with its gate oxide film has a thickness $T_{ox}$=1000Å and the resistivity of the p type substrate is $\rho_{sub}$=7Ωcm. FIG. 4 is the result of a sample wherein $T_{ox}$=500Å and $\rho_{sub}$=7Ωcm. FIG. 5 shows the result of a sample wherein $T_{ox}$=500Å, and $\rho_{sub}$=20Ωcm. In all of these samples, the depths of the n+ type source region and the n+ type drain region are invariably 0.5 µm, and the doping amounts of the channels by implantation of boron (B) are identical such as 5~7×10$^{16}$ cm$^{-3}$. In case $L_{eff}$ is long, the memory holding time in each of these samples is long, being about 100 seconds. However, for a shorter $L_{eff}$, the holding time sharply becomes shorter In the sample of FIG. 5 in which $L_{eff}$ is 2.5 µm, the result of observation is such that even by the application of a substrate bias voltage $V_{sub}$, the memory holding time lasts no longer than about 100 µsec. In other words, with respect to the sample shown in FIG. 5, it should be understood that unless $L_{eff}$ is 3.5 µm or greater, the device will no longer operate as a d-RAM. On the other hand, with the sample shown in FIG. 3, it will be understood that, if the substrate bias voltage $V_{sub}$ is set at –4V, the memory contents are held for a sufficient period of time, even if the effective channel length is reduced up to $L_{eff}$=1.5 µm. However, even in this sample shown in FIG. 3, in case the effective channel length is reduced to $L_{eff}$=0.5 µm, the device can no longer be used as a d-RAM. In the sample shown in FIG. 4, even when $V_{sub}$= –4V, the memory contents-holding time is noted to begin dropping when $L_{eff}$=1.5 µm.

As will be understood from the foregoing description of samples, in case the channel length is shortened for the purpose of improving the packing density, if the channel length is reduced to about L=1 um ($L_{eff}$=about 0.5 µm), the memory content holding time drops sharply so that the device will no longer be operated as a d-RAM.

Next, explanation will be made of the reasons for the phenomenon that, in case the channel length is reduced as shown in FIGS. 3 to 5, the memory contents become extinguished sharply. A reduced length of channel gives rise to the effect of lowering, due to the effect provided by the source and drain regions, the potential barrier which, in case the channel length is not shortened, serves to prevent the flow of electrons across the source region and the drain region. In a sample having a long channel, the height of the potential barrier in the channel region is controlled almost solely by both the gate voltage $V_G$ and the substrate voltage $V_{sub}$. However, in case the length of channel is reduced, the potential barrier height will become controlled also by the source region potential and the drain region potential. In other words, a static induction effect which is noted in a static induction transistor (SIT) begins to appear in the device having a substantially reduced length of channel, so that a current will become allowed to flow across the source and the drain regions even without an application of a gate voltage. Such current will hereunder be called an SIT current or a sub-threshold current. In FIG. 6 will be shown the relationship between the drain current $I_d$ and the drain voltage $V_d$ (a voltage relative to the source voltage when the latter is zero) for the sample shown in FIG. 3 but wherein the channel length L at mask level is 1 µm ($L_{eff}$=0.5 µm). The vertical axis represents the drain current $I_d$, and the horizontal axis represents the drain voltage $V_d$. FIG. 6 shows the fact that, even in case the gate voltage $V_G$=0, there flows a current $I_d$ across the source and drain regions. It is needless to say that, when the magnitude of the negative substrate bias voltage $V_{sub}$ is augmented, the drain current $I_d$ will become smaller. That is, even when the gate voltage is set at $V_G$=0, there will begin to flow a current across the source and drain regions when a certain amount of voltage is applied therebetween.

In a d-RAM which is in the state that a voltage $V_m$=$V_w$–$V_{th}$ is written in the storage capacitor $C_s$ and is stored therein, it should be understood that the voltage $V_m$ is being applied across the source and drain regions. Accordingly, there naturally flows such drain current $I_d$ as that shown in FIG. 6, and thereby the stored voltage decreases progressively. The process of reduction of the stored voltage due to the current flowing across the source and drain regions can be analyzed easily. Since the device may be expressed in an equivalent circuit as shown in FIG. 7, the voltage stored in the storage capacitor $C_s$ will attenuate by the current which flows through the MOS-FET $T_1$. By designating the voltage of the storage capacitor $C_s$ as V, the process of attenuation of the voltage can be expressed by the following formula:

$$-C_s \frac{dV}{dt} = I_d, \qquad (1)$$

wherein t represents time.

As will be understood from FIG. 6, the subthreshold current $I_d$ varies substantially exponentially relative to the voltage of the storage capacitor. That is, the sub-threshold current can be expressed by $I_d$=$I_0 e^{\alpha V}$, wherein $I_0$ and a can vary depending on the substrate bias $V_{sub}$. The abovementioned Formula (1) under an initial condition $V_0$=$V_m$ can be solved as follows:

$$V_t = \frac{1}{\alpha} \ln \frac{1}{\frac{\alpha I_0}{C_s} t + e^{-\alpha V_m}}. \qquad (2)$$

The time required for $V_t$ to become 1/r of the initial voltage $V_m$ will be:

$$t_r = \frac{C_s}{\alpha I_0} \left( e^{-\frac{\alpha V_m}{r}} - e^{-\alpha V_m} \right). \quad (3)$$

The value obtained from calculation on the basis of r=2, and the value obtained from actual measurement are shown in FIG. 8. In FIG. 8, the memory-holding time is plotted as a function of the substrate bias voltage. In this Figure, mark o represents the value of measurement, and mark + represents the value of calculation. It will be noted that these two kinds of values are substantially in agreement with each other. More particularly, the attenuation of the stored voltage for a device having a reduced channel length is brought about by the sub-threshold current flowing across the source and the drain regions. Next, comparison is made between FIG. 3 and FIG. 4. It will be noted that the memory-holding characteristic for a reduced channel device is poor with the sample shown in FIG. 4. In other words, the smaller the thickness $T_{ox}$ of the gate oxide film becomes, the more the memory-holding characteristic degradates. This relationship will be described briefly as follows.

Referring back to FIG. 1, the gate region 14 of the n-channel MOS-FET is formed most frequently with an $n^+$ type polysilicon. A sectional construction taken in one-dimensional direction from the gate region 14 toward the p type substrate 11 is shown in FIG. 9. The thickness of the p type substrate 11 is indicated by d. The gate oxide film 15 has a dielectric constant $\epsilon_2$ and the p type substrate 11 has a dielectric constant $\epsilon_1$. The potential profile when a reverse bias voltage $V_a$ (including a built-in potential $V_{bi}$) is applied across the p type substrate 11 and the $n^+$ type gate electrode 14 is expressed by the formula:

$$V_a = V_0 + V_{sc}, \quad (4)$$
and $$\frac{\epsilon_2}{T_{ox}} V_0 = N_A q W, \quad V_{sc} = \frac{N_A q}{2\epsilon_1} \cdot W^2, \quad (5)$$

wherein:

$V_0$ represents a voltage applied to the gate oxide film 15:

$V_{sc}$ represents a voltage applied to the p type substrate;

$N_A$ represents an impurity concentration of the p type substrate 11; and q represents a unit charge.

From Formulas (4) and (5), the width W of the depletion layer in the p type substrate 11 and the voltage $V_0$ which is applied to the gate oxide film are obtained as follows:

$$W = \frac{\epsilon_1}{\epsilon_2} T_{ox} \left\{ -1 + \sqrt{1 + \left(\frac{\epsilon_2}{\epsilon_1} \cdot \frac{W_a}{T_{ox}}\right)^2} \right\} \quad (6)$$

$$V_0 = \frac{N_A q \epsilon_1 T_{ox}^2}{\epsilon_2^2} \left\{ -1 + \sqrt{1 + \left(\frac{\epsilon_2 W_a}{\epsilon_1 T_{ox}}\right)^2} \right\}. \quad (7)$$

Also, the intensities $E_0$ and $E_s$, of electric fields in the gate oxide film 15 and in the p type region 11 are expressed as:

$$E_0 = \frac{N_A q \epsilon_1 T_{ox}}{\epsilon_2^2} \left\{ -1 + \sqrt{1 + \left(\frac{\epsilon_2}{\epsilon_1} \cdot \frac{W_a}{T_{ox}}\right)^2} \right\}, \quad (8)$$

and $$E_s = \frac{N_a q T_{ox}}{\epsilon_2} \left\{ -1 + \sqrt{1 + \left(\frac{\epsilon_2}{\epsilon_1} \cdot \frac{W_a}{T_{ox}}\right)^2} \right\} \cdot \frac{W - x}{W} \quad (9)$$

wherein:

$$W_a = \left(\frac{2\epsilon_1 V_a}{N_A q}\right)^{1/2},$$

and represents the width of the depletion layer when the voltage $V_a$ is applied solely to the p type substrate 11.

The potential distribution within the p type substrate 11 is shown in FIG. 10 where the thickness $T_{ox}$ of the gate oxide film is varied. This Figure represents the result when the gate potential is maintained at the same level of the source potential. The vertical axis represents the potential, and the horizontal axis represents the distance from the gate oxide film 15 up to the p type substrate 11. The Figure shows the state in which only a built-in potential $V_{bi}$ is applied, when the substrate bias voltage $V_{sub}$=0. It should be noted here that $V_{bi}$ represents a built-in potential at the junction of the $n^+$ type region and the p type region. The symbol 0 given at the vertical axis represents a source potential. When $T_{ox}$=0, the potential profile takes the curve as indicated by ①, and the potential at the interface of the p type region is rendered to a same level as that of the source potential. As $T_{ox}$ increases, the potential at the interface of the oxide film will increase as indicated by ②. When $T_{ox}=\infty$, i.e. when the oxide film has a substantially large thickness, the potential curve will assume constant patterns as shown by broken lines. Conversely, as $T_{ox}$ decreases, the interface potential approaches the potential of the source region. This means that electrons are allowed to enter easily into this lowered potential region from either the source region or the drain region, so that a current is thus allowed to flow.

The attempt to develop a short channel structure necessitates a further reduction of the thickness of the gate oxide film. As a result, the tendency that the surface potential drops and that accordingly the current is allowed to flow easily will become more conspicuous. Also, as the channel length is shortened further, the storage capacitance $C_s$ becomes smaller. At the same time therewith, the write-in voltage $V_w$ for writing-in the memory cell will decrease also. Since the electric charge Q which is stored in the storage capacitor under the written-in state is given by $C_s V_m$, the value $Q=C_s V_m$ also naturally decreases as the length of the channel decreases. In case the storage capacitor $C_s$ is formed with $SiO_2$ of 300Å into 10μm square in size, the storage capacitance $C_s$ will be about 0.12 pF. The stored electric charge when $V_m$ of 5V is stored on this $C_s$ will be: $Q=C_s V_m=6\times 10^{-13}$C, which represents about $3\times 10^6$ in number of the electrons stored or in number of shortage of electrons.

However, the energy of alpha-particles which are irradiated from the ceramic package or the like is said to be of the order of 5 MeV. When a single alpha-particle is irradiated within a semiconductor body, there will be produced about one million pairs of electrons and holes. This single alpha-particle which is irradiated constitutes an amount sufficient for cancelling out almost all of the electric charge which has been stored in the storage capacitor. In other words, even where other holding conditions are perfect, the electric charge which is being stored in the storage capacitor will become extinguished by the irradiation of only a single alpha-particle.

SUMMARY OF THE INVENTION

It is, therefore, a primary object of the present invention to provide a semiconductor device whose memory retention characteristic will not degrade even where the channel length of this device is shortened.

Another object of the present invention is to provide a semiconductor device of the type described above, whose memory holding characteristic will not degrade even where the gate oxide film thereof has a reduced thickness.

Still another object of the present invention is to provide a semiconductor device of the type described above, which permits a further improvement in packing density in view of the foregoing features.

Yet another object of the present invention is to provide a semiconductor device of the type described above, whose memory content will not become extinguished even by the introduction thereinto of an alpha particle.

A further object of the present invention is to provide a semiconductor device of the type described above, which is suitable for use as a d-RAM.

Still another object of the present invention is to provide a semiconductor device of the type described above, which is suitable for use as a CMOS.

DETAILED DESCRIPTION OF THE PREFERRED EMBODIMENTS

Figure 3:
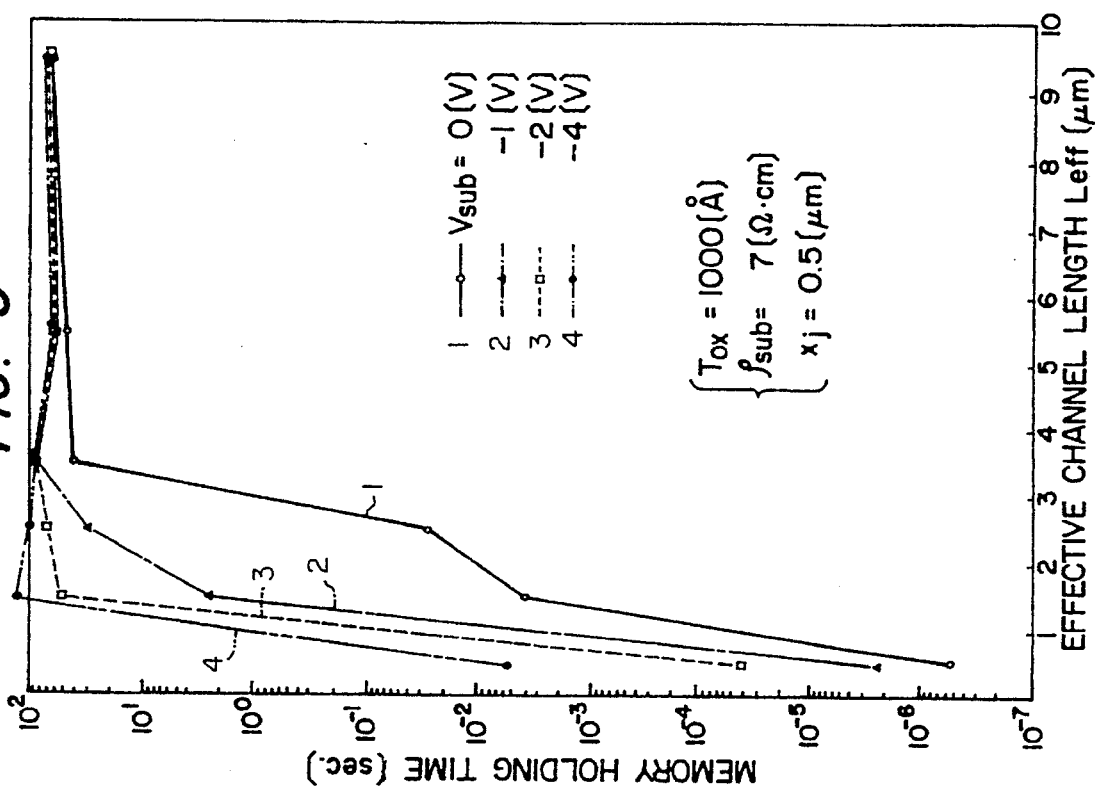
FIGS. 3 to 5 are charts for explaining the dependency characteristic of memory holding time upon effective channel length of the MOS-FET of FIG. 1.
Figure 5:
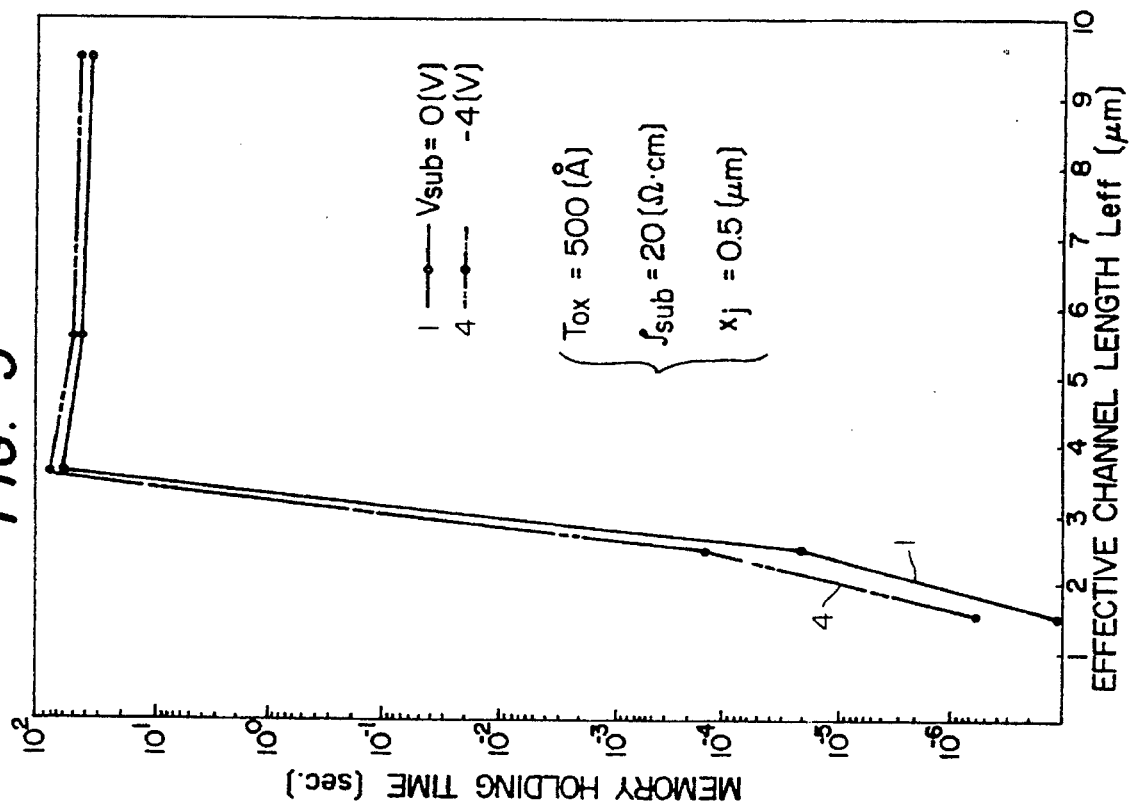
Figure 4:
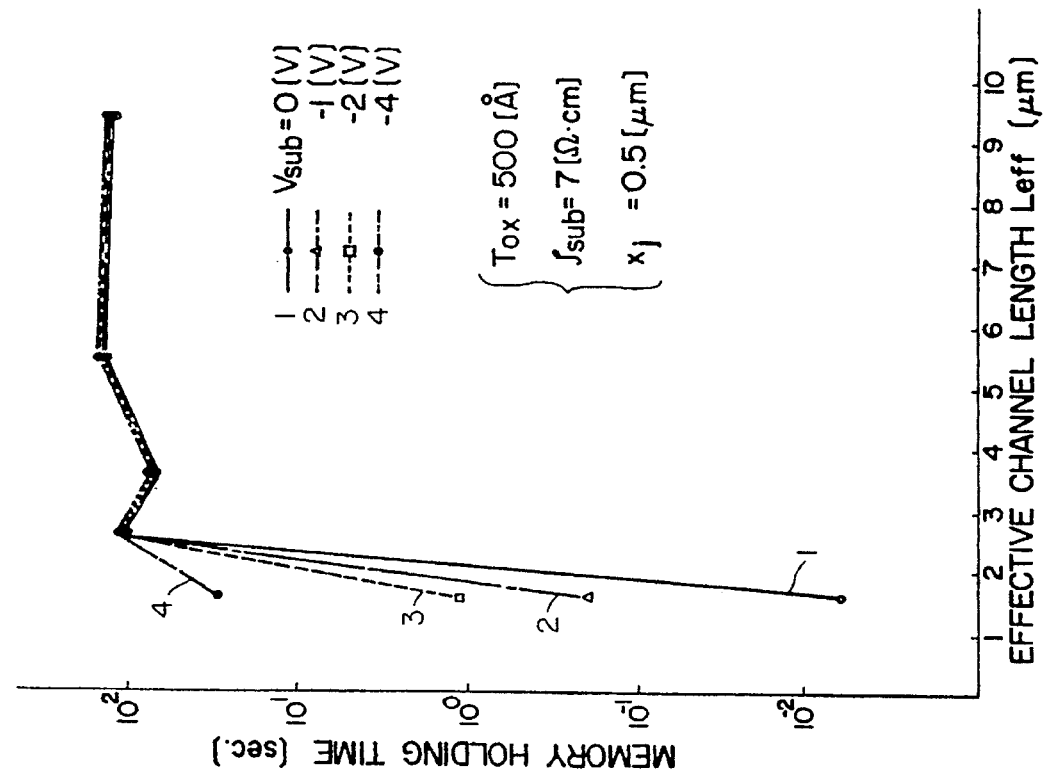
Figure 6:
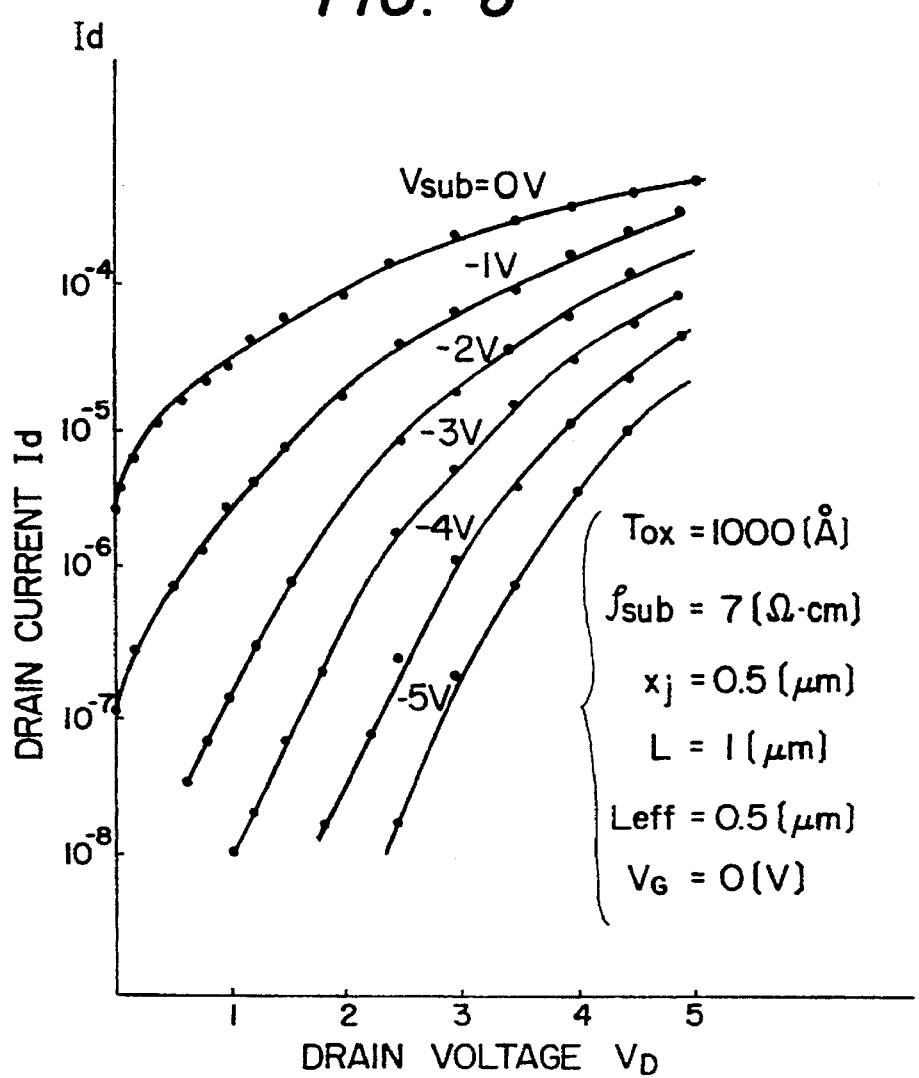
FIG. 6 is a chart for explaining the dependency characteristic of drain current upon drain voltage.
Figure 7:
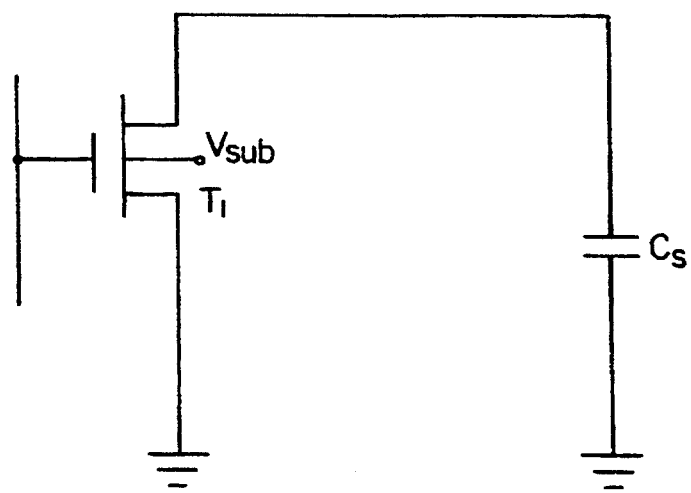
FIG. 7 is a circuit diagram for analyzing memory holding characteristics.
Figure 8:
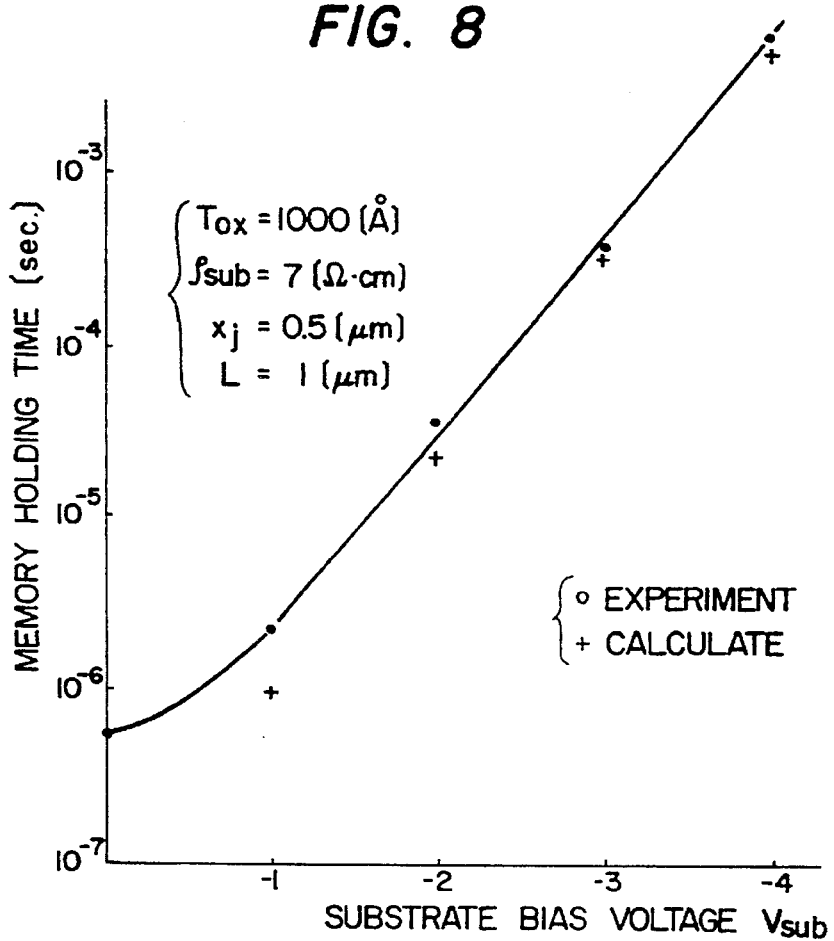
FIG. 8 is a chart for explaining the dependency characteristic of memory holding time upon substrate bias voltage.
Figure 9:
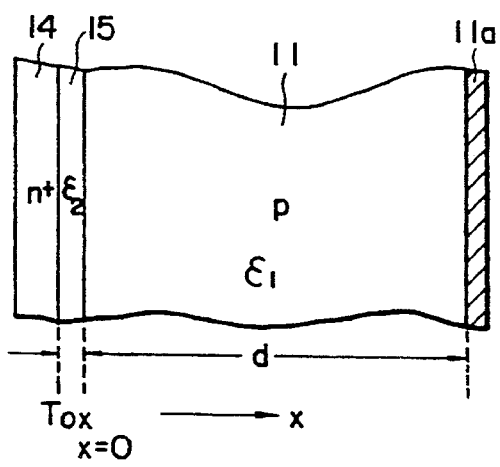
FIG. 9 is a diagrammatic illustration of a sectional structure in one dimensional direction as taken from the gate region to the p type substrate of the MOS-FET shown in FIG. 1.
Figure 10:
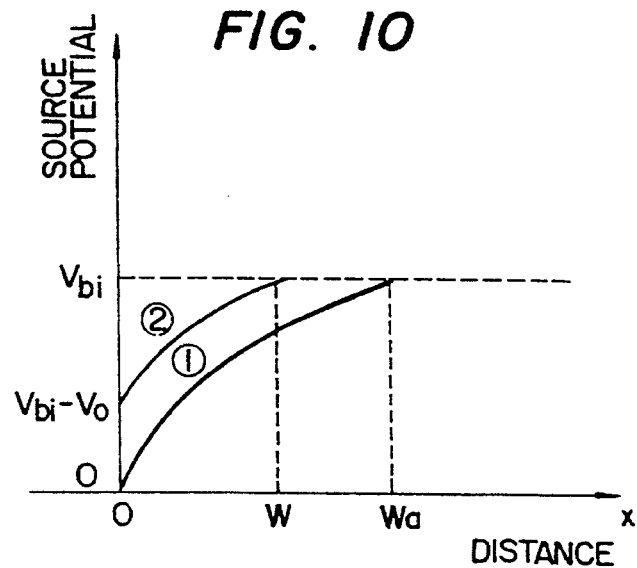
FIG. 10 is a chart showing the potential profile within the p type substrate at a location just below the gate oxide film in case of n polysilicon gate.
Figure 11:
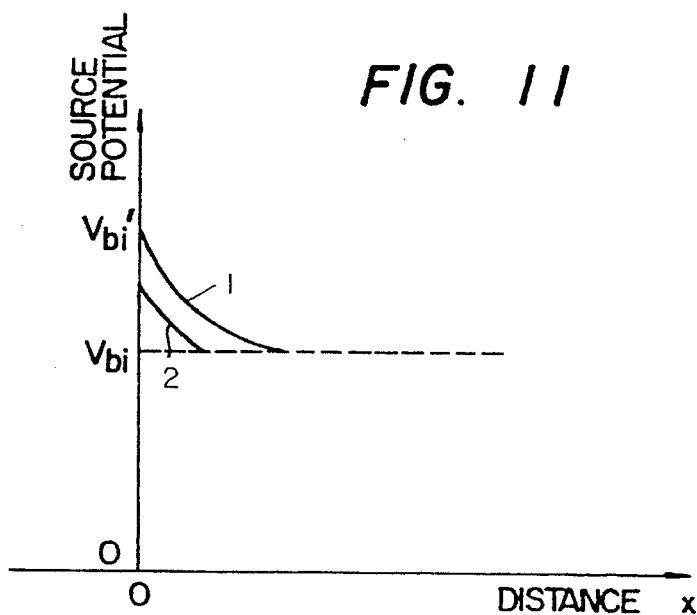
FIG. 11 is a chart showing the potential profile within the p type substrate at a location just below the gate oxide film in case the gate region is formed with a p+ type polysilicon.
Figure 12:
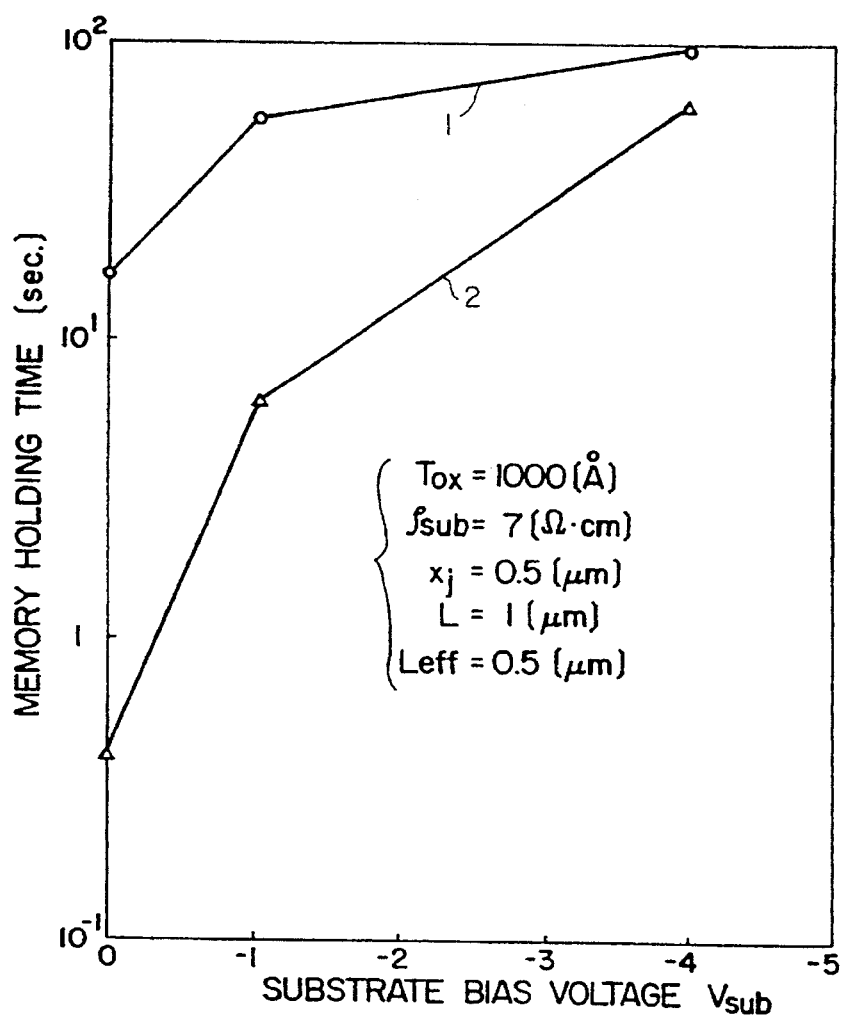
FIG. 12 is a chart for explaining the dependency characteristic of memory holding time upon substrate bias voltage of an embodiment of the present invention.

Description will hereunder be made of some preferred embodiments of the semiconductor device according to the present invention. It should be understood that, in these embodiments, the gate electrode in an n-channel MOS-FET is formed with a polysilicon of a high impurity concentration and having a conductivity type opposite to that of the source region, i.e. with a p+ type polysilicon, instead of n+ type polysilicon as in known such devices. The potential profile within the p type substrate at a location just below the gate oxide film in case the gate electrode is constructed with a p+ type polysilicon is shown in FIG. 11. Zero potential (0) in this Figure indicates the potential of the source region. $V_{bi}$, represents the built-in potential at the junction of the source region and the p+ type polysilicon region, and it is about 1.0 to 1.1V at room temperature. In case the impurity concentration of the p type substrate is about $1\times10^{15}$ cm$^{-3}$, the value of $V_{bi}$, $-V_{bi}$ will be about 0.25V. In case the gate region is formed with a p+ type polysilicon, the curve ① represents the potential profile when the thickness $T_{ox}$ of the gate oxide film is extremely small. As this $T_{ox}$ increases, the curve will assume the pattern as indicated by ②. That is, the smaller the thickness $T_{ox}$ is, the higher will become the potential at the interface between the oxide film and the p type substrate, so that electrons are allowed to flow with lesser degree of easiness. For an instance where the gate oxide thickness $T_{ox}$ is substantially large, the potential profile is illustrated by the dashed line. By using the sample shown in FIG. 3, i.e. the channel-doped device having a $T_{ox}$ of 1000Å and a p type substrate resistivity $\rho_{sub}$ of 7Ω·cm, and by forming the gate region with a p+ type polysilicon, the memory holding time of this device is measured under the same conditions as for the samples shown in FIGS. 3 to 5, and the resulting memory holding time characteristic is shown by the curve ① in FIG. 12. The device has a channel length L at mask level of 1 μm (effective channel length being 0.5 μm). In the case of the sample shown in FIG. 3, the memory holding time is very short. In FIG. 12, however, there can be obtained a memory holding time of about 6 and 100 seconds by setting $V_{sub}$ at 0V and −4V. Just for reference sake, the memory holding time in a device having a conventional $n^+$ type polysilicon gate region is measured under the same conditions as mentioned above, is 6 μsec and 6 msec at $V_{sub}$=0V and −4V. The trend of improvement in the memory holding time resulting from the employment of a $p^+$ type polysilicon gate region in the n-channel device becomes more prominent as the thickness $T_{ox}$ is made smaller. The curve ② in FIG. 12 represents the result obtained in case the gate electrode is made with platinum (Pt). It should be noted here that a sufficient improvement in the memory holding time is effected also by forming the $p^+$ type gate region with platinum. In addition to the instance where platinum is used, almost similar results can be obtained also from the use of molybdenum (Mo) and tungsten (W) which have a certain high Schottky potential barrier and remain stable even for high temperature process. It should be understood that, in attempts for shorter channel lengths, there will arise the tendency that the gate resistance becomes higher, so that the construction of the gate with a metal has sufficient significance. It should be understood also that similar good results can be obtained from metal silicide such as molybdenum silicide, ($MoSi_2$), tungsten silicide ($WSi_2$), titanium silicide ($TiSi_2$), tantalum silicide ($TaSi_2$), platinum silicide (PtSi), etc. These materials have a certain high Schottky barrier height for the source region (bit line region), i.e. $n^+$ region in this case.

Figure 1:
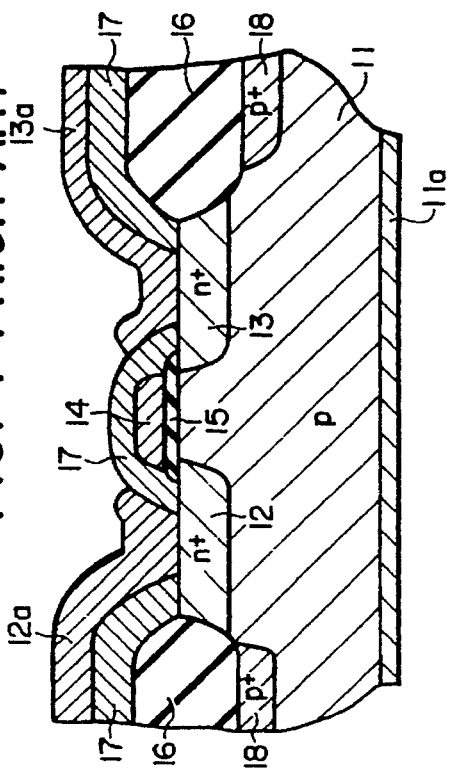
FIG. 1 is a diagrammatic sectional view, showing the structure of a conventional MOS-FET cell.
Figure 13:
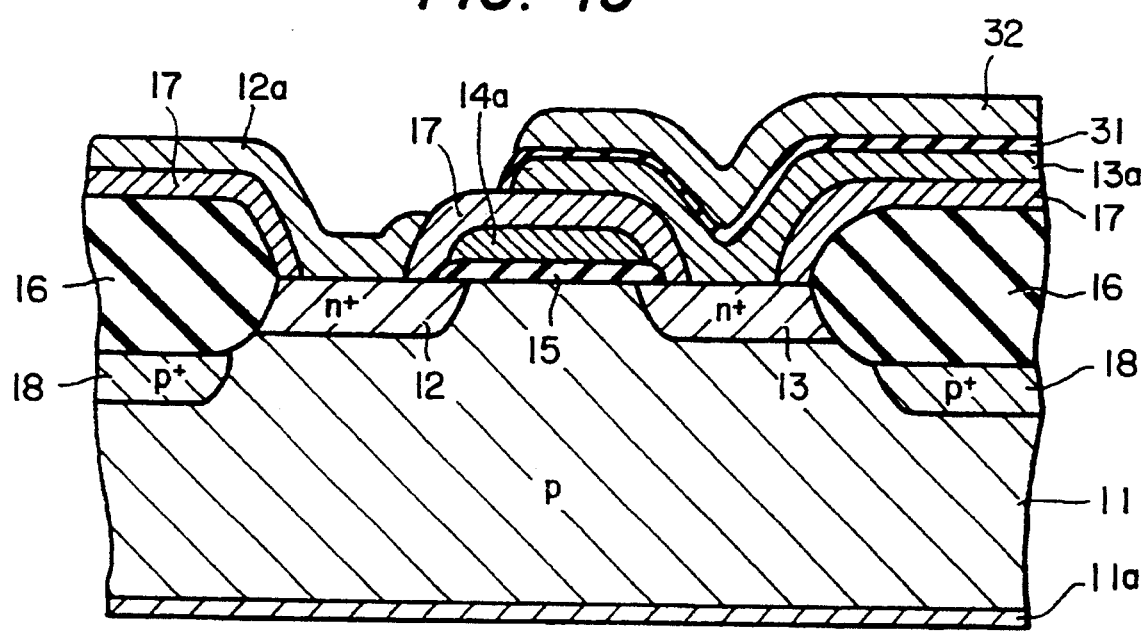
FIGS. 13 to 18 are diagrammatic sectional views, showing the structures of d-RAM cell according to embodiments of the present invention.

A sectional view of the structure of an n-channel d-RAM cell having a $p^+$ type polysilicon gate region according to the present invention is shown in FIG. 13. Like parts as in FIG. 1 are given like reference numerals and symbols, and their explanation is omitted. Numeral 14a represents a gate electrode made of $p^+$ type polysilicon, 13a an $n^+$ type polysilicon, 31 a thin oxide film, and 32 a metal electrode such as aluminum. In this instant structure, a storage capacitor $C_s$ is formed by 13a, 31 and 32. In the embodiment of FIG. 13, the gate electrode 14a is formed only by a $p^+$ type polysilicon. It should be understood, however, that in such instances where attempts are made for smaller channel lengths and for higher packing density, bringing about an excessively high resistance of the word line and disturbance in operation, it is effective to provide a $p^+$ type polysilicon layer on the gate oxide film 15 and also a platinum layer on top of this $p^+$ type polysilicon layer to thereby lower the resistance of the word line. In place of platinum layer, molybdenum or tungsten or metal silicide layer may be provided. It is also useful to provide multilayers of such metals as platinum, molybdenum and tungsten. Or, alternatively, there may be provided nothing else but only metal layers such as Mo, W and Pt, without the use of $p^+$ type polysilicon. In any way, there may be used metals, provided that they have a high melting point and that they will not be damaged during subsequent processes conducted at high temperature.

Figure 2:
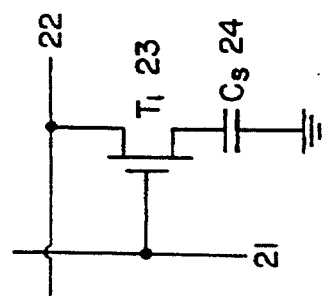
FIG. 2 is a circuit diagram of a known d-RAM cell.

The data shown in FIG. 12 represent what have been measured with respect to the arrangement shown in FIG. 2 where a terminal of the storage capacitor $C_s$, i.e. the aluminum electrode 32, is grounded. In other words, these are data with respect to the depletion storing mode operation where the shortage of amount of electrons is memorized. In contrast thereto, it is natural that the d-RAM cell shown in FIG. 13 is intended for accumulation storing mode operation which is ordinarily practiced by the application of a positive voltage $V_{ss}$ to the aluminum electrode 32, i.e. this d-RAM cell is operated so as to accumulate excessive electrons in the $n^+$ type drain region 13. It should be noted here that the accumulation storing mode operation has such disadvantage that the memory holding time becomes shortened when subjected to a high temperature, as compared with the depletion storing mode operation.

Figure 14:
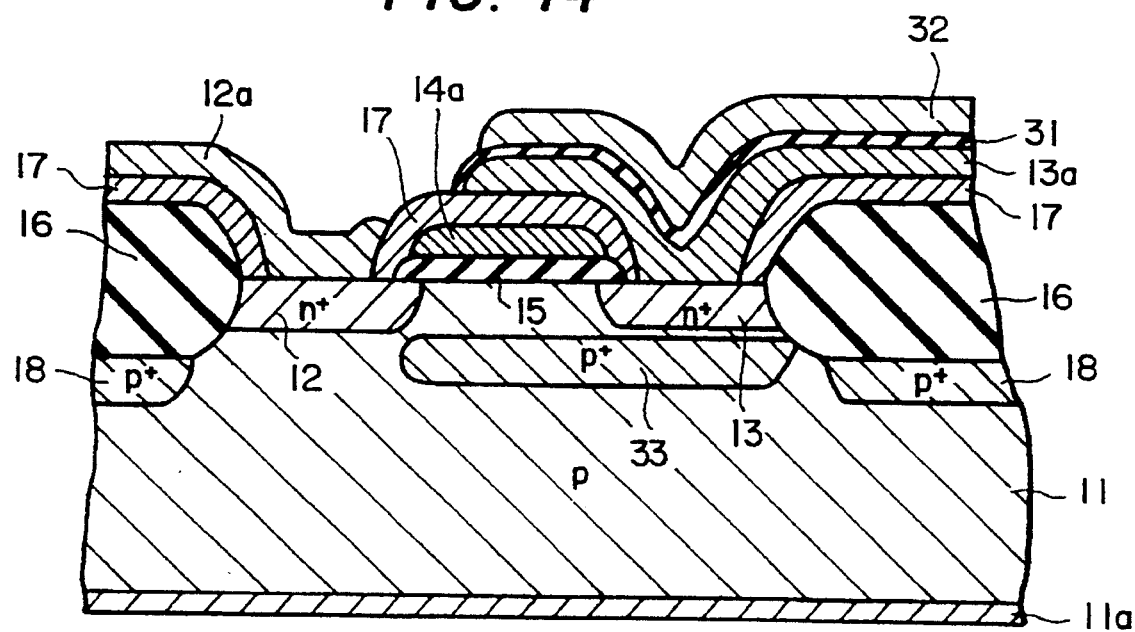
Figure 15:
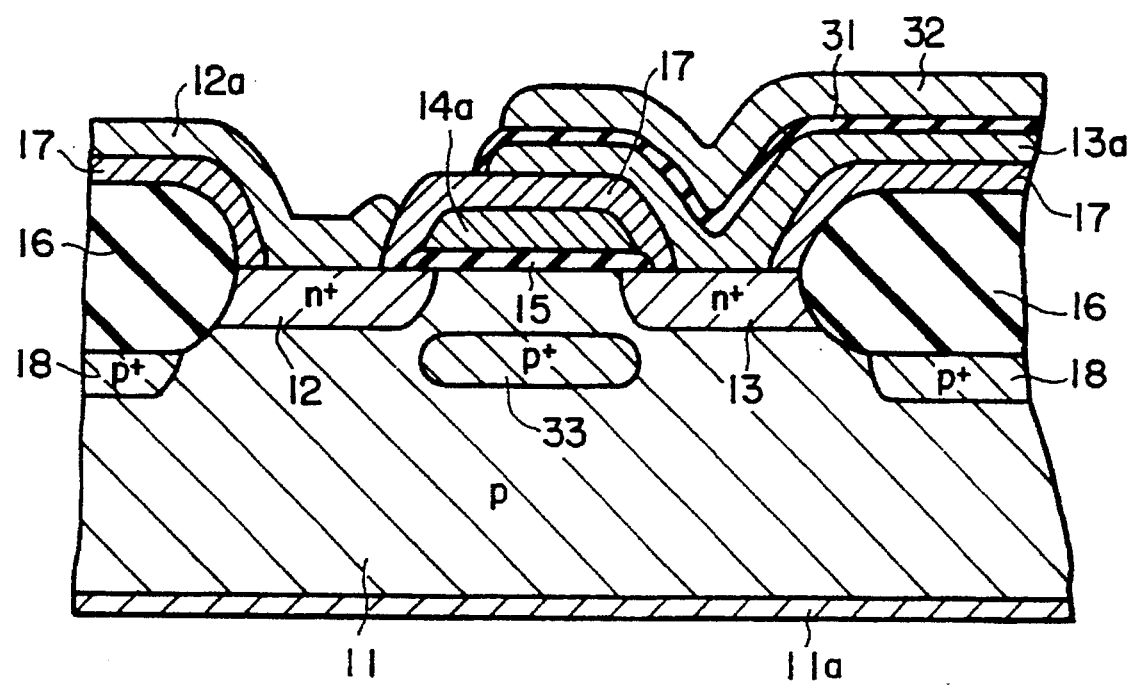
Figure 16:
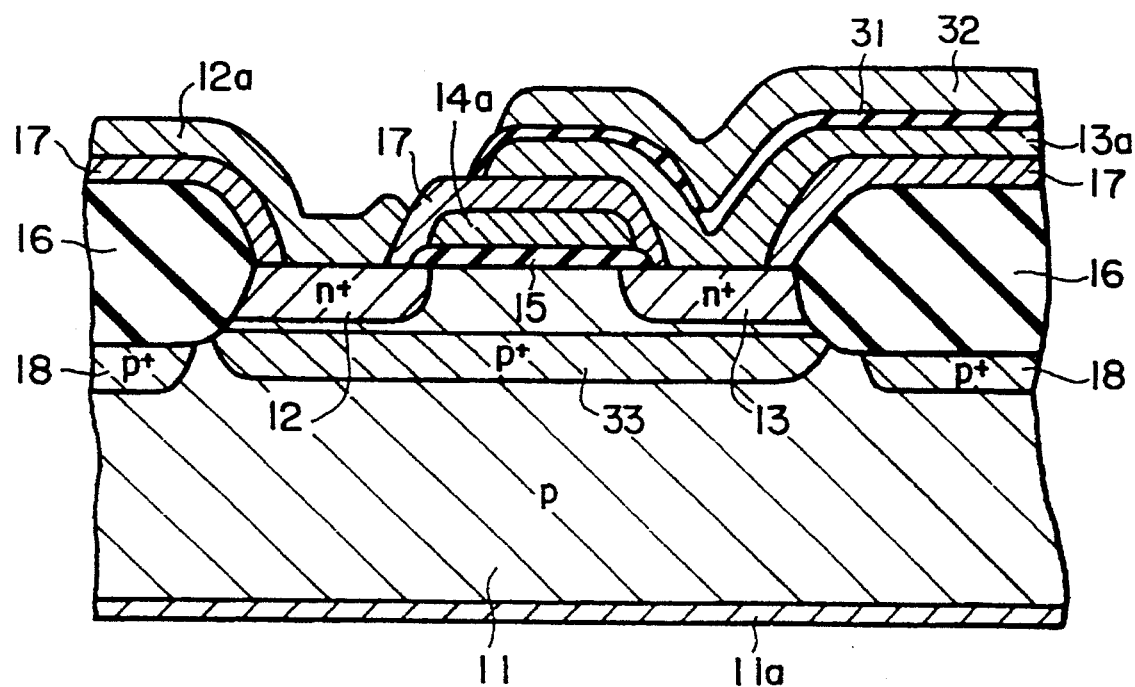
Figure 17:
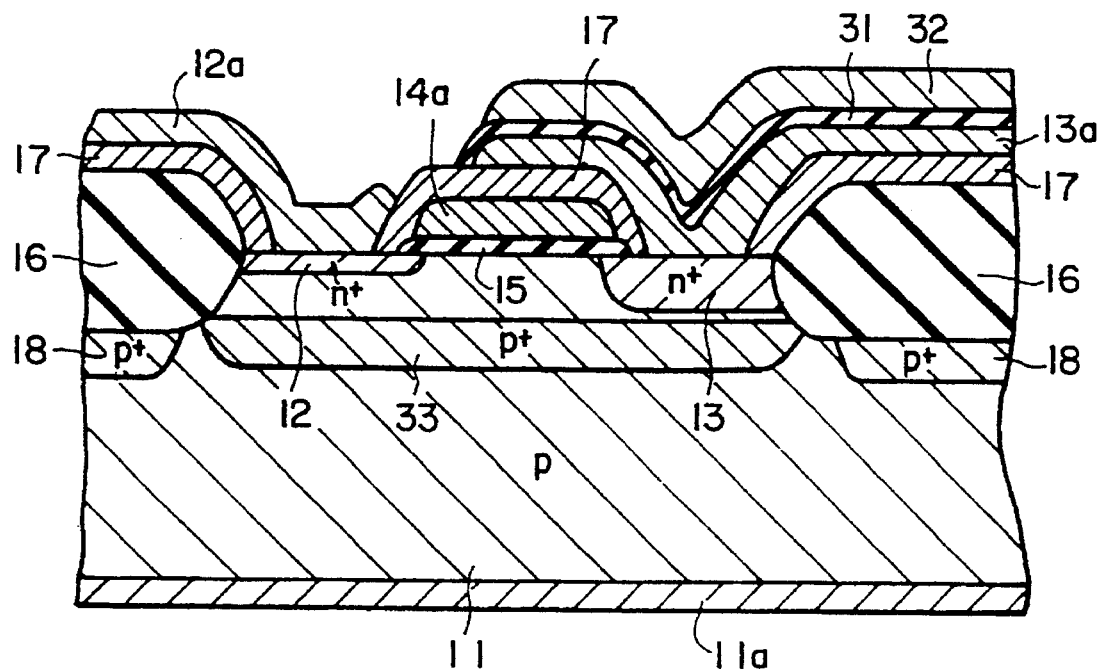

In the n-channel MOS transistor having a $p^+$ type polysilicon gate region according to the present invention, the potential barrier which is produced at the interface between the gate oxide film 15 and the p type substrate 11 is higher than that produced in the conventional n-channel MOS transistor having an $n^+$ type polysilicon gate region. As the smaller channel length is intended, the depths $x_j$ of the $n^+$ type source region 12 and the $n^+$ type drain region 13 are also made accordingly smaller. In such instance also, a sub-threshold current tends to flow not only in the vicinity of the interface of junction, but also across the source region and the drain region due to internal bulk conduction, thus degradating the memory holding characteristic. In order to suppress such flow of sub-threshold current, it is effective to provide a $p^+$ type buried region in the interior portion of the semiconductor body. For example, a $p^+$ type region is buried, along the channel, in that part of the substrate at a location deeper than the depths of the $n^+$ type regions 12 and 13. Accordingly, the inner potential barrier in the bulk region of the substrate has a greater height, so that the sub-threshold current is reduced further. Such arrangement of device is shown in FIG. 14. The embodiment of FIG. 14 shows the instance where the $p^+$ type buried region 33 reaches as far as that portion of the p type substrate 11 located below the $n^+$ type drain region 13. That portion of this $p^+$ type buried region 33 located below the $n^+$ type drain region 13 may have an impurity concentration identical with that of the portion of the buried region 33 located along the channel region, or the portion of the buried region 33 located along the channel region may have a higher impurity concentration than that of the remaining portions thereof, such as channel region. Alternatively, the $p^+$ type buried region 33 may be provided only in that site located along the channel region as shown in FIG. 15. The $n^+$ type source region 12 desirably is separated apart from the $p^+$ type buried region 33, in order not to make the capacity of the bit line large. It is needless to say that the $p^+$ type buried region 33 may extend as far as that portion of the p type substrate 11 located below the $n^+$ type source region 12, as shown in FIG. 16. In this embodiment, the bit line capacitance is liable to become large. In order to decrease the bit line capacitance, the $n^+$ type source region 12 is formed to be sufficiently shallow so that this $n^+$ type source region 12 is separated sufficiently away from the $p^+$ type buried region 33 as shown in FIG. 17. This $p^+$ type region need only to have such impurity concentration as will not develop breakdown when write-in voltage is accumulated. Thus, the impurity concentration of the $p^+$ type region is set at the order of $10^{17}$ cm$^{-3}$.

Figure 18:
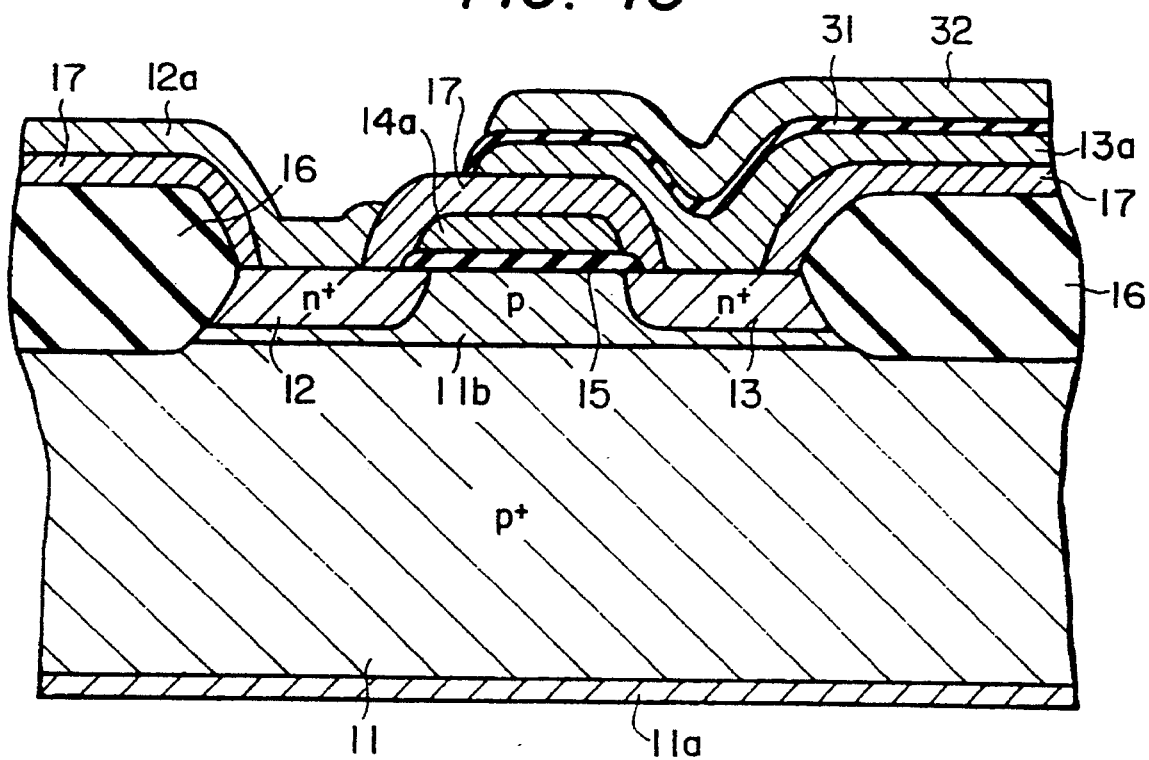

Similar effect can be brought about by the arrangement shown in FIG. 18 wherein the substrate 11 is formed with $p^+$ type, and a p type layer 11b is formed on top of this $p^+$ type substrate 11. It is needless to say that the $n^+$ type drain region 13 is in direct contact with the $p^+$ type substrate 11. What requires to be taken care of is to arrange so as to avoid the occurrence of flow of current due to the breakdown of either the $n^+$ type drain region and the $p^+$ type substrate 11 or the $n^+$ type source region 12 and the $p^+$ type substrate 11, caused by the application of a write-in voltage. Also, a consideration about a substrate bias voltage is required. In this instant case also, like the instances shown in FIGS. 14 to 17, it is desirable to arrange the n⁺ type source region 12 so as to be directly adjacent the p⁺ type substrate 11, where the bit line capacitance tends to increase.

Figure 19:
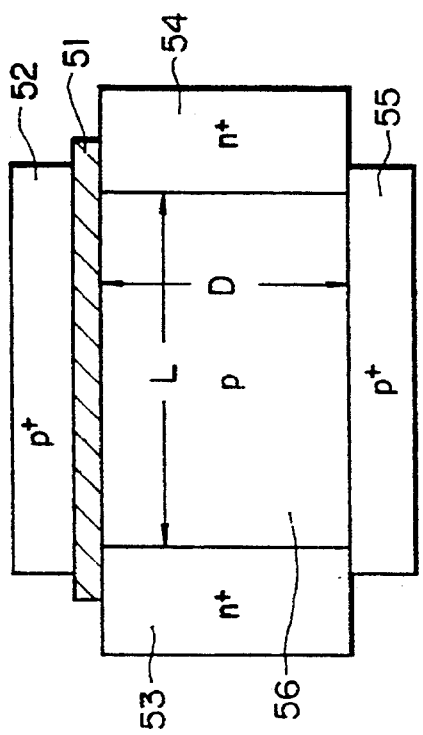
FIG. 19 is a diagrammatic explanatory sectional view of a model device for analyzing potential profile.
Figure 20:
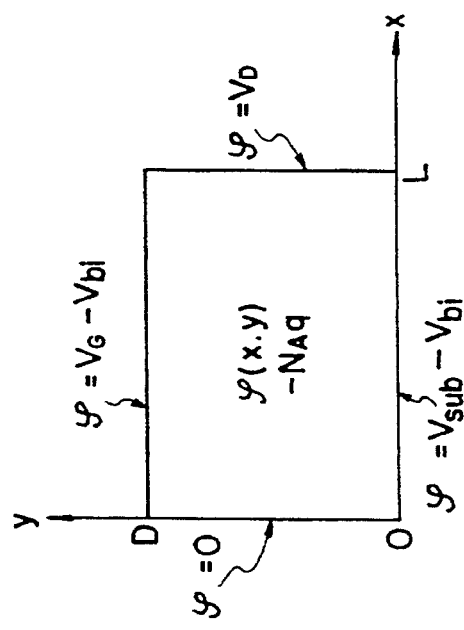
FIG. 20 is a chart for explaining the boundary condition of the potential profile in the channel region of the model shown in FIG. 19.

Next, description will be made of the turn-off state of the MOS transistor as shown in FIGS. 14 to 18. In order to facilitate the analysis, the MOS transistor which is to be explained here is approximated to a rectangular structure as shown in FIG. 19. On top of a thin $SiO_2$ gate oxide film 51 is provided a p⁺ type polysilicon gate region 52, and at both lateral ends are provided an n⁺ type source region 53 and an n⁺ type drain region 54. The p⁺ type region located at the bottom in this Figure corresponds to the buried region. The distance between the source region and the drain region is designated as L, the channel depth from the gate oxide film 51 to the p⁺ type buried region 55 as D, and the impurity concentration of the channel region 56 as $N_A$. The potential within the channel region 56 will be sought, under the condition that the potential of the n⁺ type source region 53 is assumed to be 0V, and that a potential $V_G-V_{bi}$ is applied to the p⁺ type gate region 52, and that a potential $V_{sub}-V_{bi}$ is applied to the p⁺ type buried region 55 and also that a potential $V_D$ is applied to the n type drain region 54. For the purpose of simplicity, let us assume that the oxide film 51 has a sufficiently small thickness, and that the channel region 56 is completely depleted. The potential profile $\phi(x, y)$ in the effective channel region 56 is derived under the above-mentioned boundary conditions as shown in FIG. 20, as follows:

$$\phi(x_n, y_n) = \frac{4V_D}{\pi} \sum_{n=0}^{\infty} \frac{\sinh\{(2n+1)\pi L_n x_n\} \cdot \sin\{(2n+1)\pi y_n\}}{(2n+1)\sinh\{(2n+1)\pi L_n\}} +$$

$$\frac{4(V_{sub}-V_{bi})}{\pi} \sum_{n=0}^{\infty} \frac{\sinh\left\{\frac{(2n+1)\pi(1-y_n)}{L_n}\right\} \cdot \sin\{(2n+1)\pi x_n\}}{(2n+1)\sinh\left\{\frac{(2n+1)\pi}{L_n}\right\}} -$$

$$\frac{4V_{bi}}{\pi} \sum_{n=0}^{\infty} \frac{\sinh\left\{\frac{(2n+1)\pi y_n}{L_n}\right\} \cdot \sin\{(2n+1)\pi y_n\}}{(2n+1)\sinh\left\{\frac{(2n+1)\pi}{L_n}\right\}} -$$

$$\frac{16 N_A q L^2}{\epsilon\pi^4} \sum_{n,m=0}^{\infty} \frac{\sin\{(2m+1)\pi x_n\} \cdot \sin\{(2n+1)\pi y_n\}}{\{(2m+1)^2 + L_n^2(2n+1)^2\}(2m+1)(2n+1)},$$
(10)

Wherein:

$$L_n = L/D, \; x_n = x/L, \; y_n = Y/D \quad (11)$$

From the formula (10), it is possible to easily obtain the potential profile within the channel region. For simplicity's sake, it is assumed that $V_{bi}=1V$.

Figure 21:
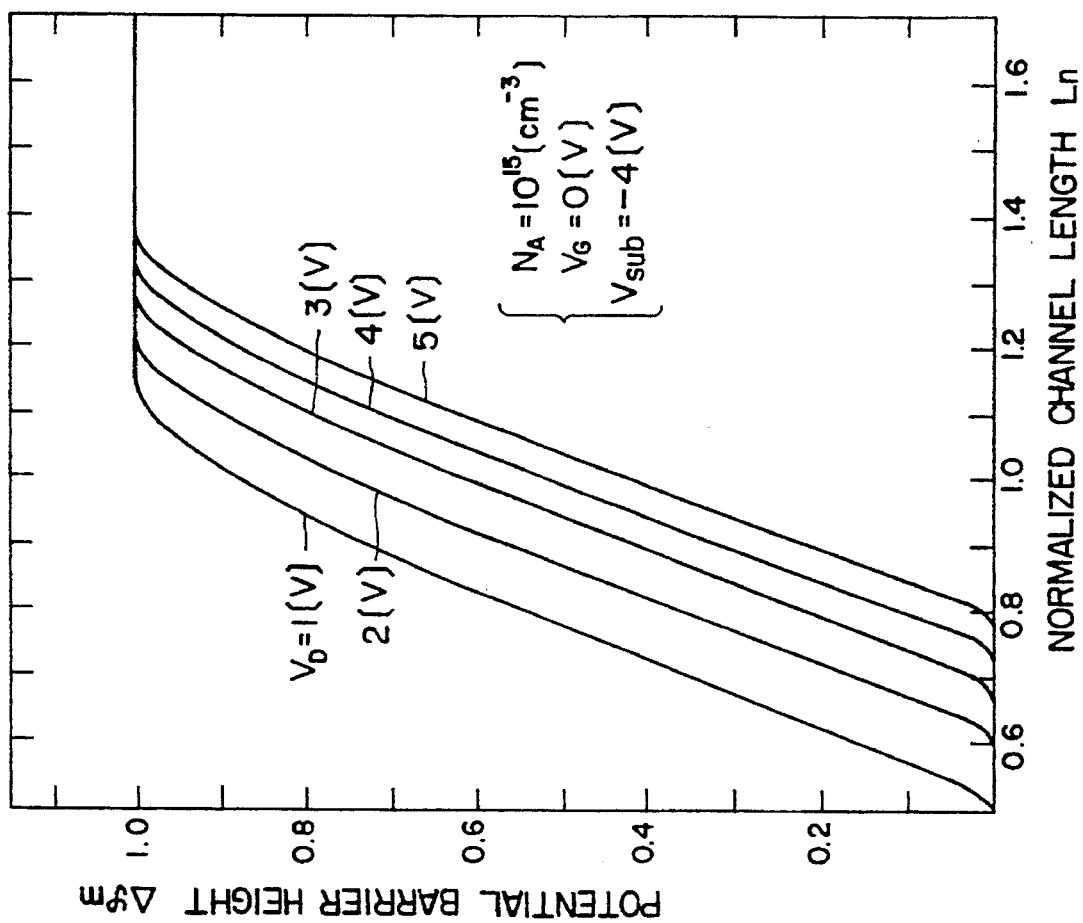
FIGS. 21 and 22 are charts for explaining the dependency characteristics of potential barrier height upon normalized channel lengths.

In FIG. 21 is shown the dependency characteristic of the height $\Delta\phi_m$ of the potential barrier produced within the channel region upon the normalized channel length $L_n$. The parameter therefor is the drain voltage $V_D$. The gate voltage $V_G$ is set at 0V, and the substrate bias voltage $V_{sub}$ is set at −4V. The drain voltage $V_D$ corresponds to the voltage $V_m$ which is stored in the storage region. In FIG. 21, the value of the normalized channel length $L_n$ for providing a same potential barrier height $\Delta\phi_m$ is noted to increase with an increase in the value of $V_D$.

Figure 23:
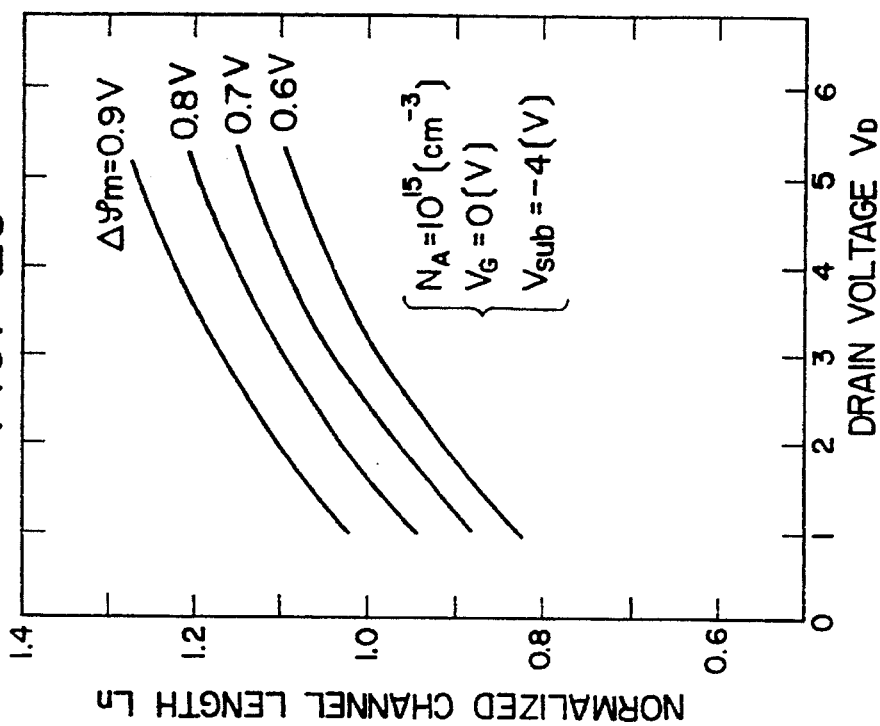
FIG. 23 is a chart for explaining the dependency characteristic of normalized channel length upon drain voltage for giving a constant potential barrier height $\Delta\phi m$.
Figure 22:
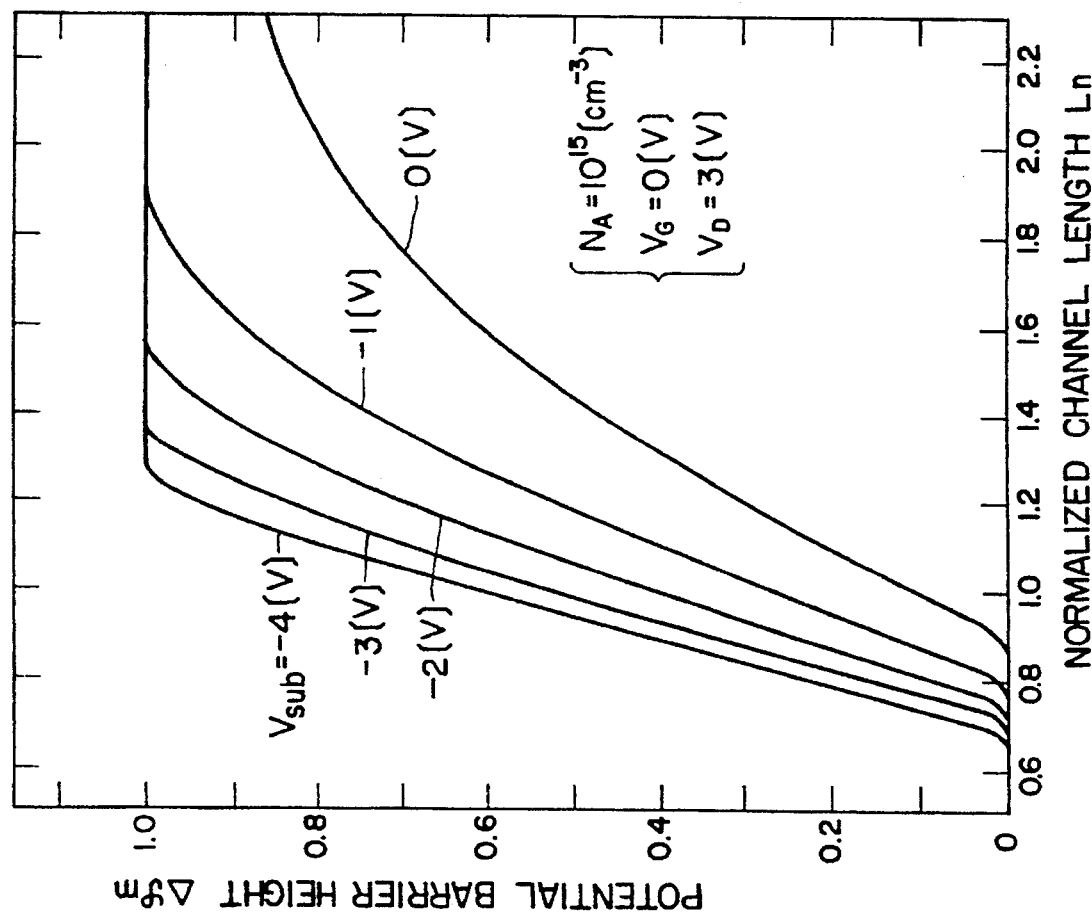

In FIG. 22 is shown the relationship between $\Delta\phi_m$ and $L_n$, with the substrate bias voltage $V_{sub}$ serving as the parameter. This Figure shows the data in case $V_G=0V$, and $V_D=3V$. As a matter of course, as the substrate bias voltage $V_{sub}$ becomes smaller, the value of $L_n$ for giving a same value of $\Delta\phi_m$ becomes greater. The process in which the normalized channel length $L_n$ for imparting a same potential barrier height $\Delta\phi_m$ increases with an increase in the drain voltage $V_D$ is shown in FIG. 23. The value of $L_n$ for giving $\Delta\phi_m=0.7V$ is about 0.96 when, for example, $V_D=2V$, and it is 1.05 at $V_D=3V$, and it is 1.14 at $V_D=5V$.

Figure 24:
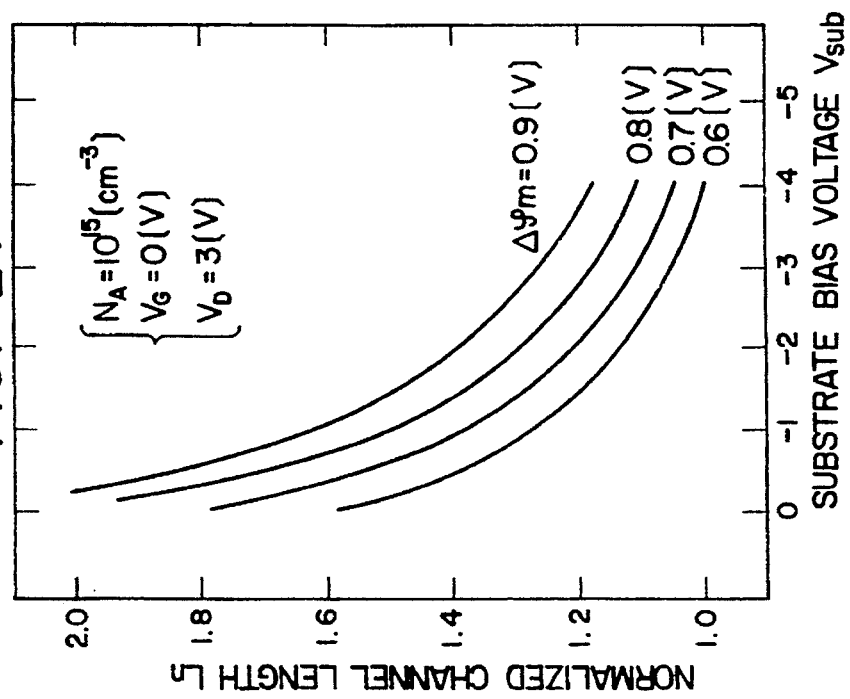
FIG. 24 is a chart for explaining the dependency characteristic of normalized channel length upon substrate bias, for giving a constant potential barrier height $\Delta\phi m$.

In FIG. 24 is shown the relationship between $L_n$ and $V_{sub}$ for the respective values of $\Delta\phi_m$ when $V_D=3V$. Needless to say, $L_n$ for giving a same $\Delta\phi_m$ becomes smaller with an increase in $V_{sub}$. In the instant structure, it is possible to give $\Delta\phi_m=0.7V$ at $L_n=1.8$ even at $V_{sub}=0V$, i.e. even in the state in which no bias voltage is applied to the substrate.

If the potential barrier height $\Delta\phi_m$ is about 0.7V, the memory holding time of the device serving as a d-RAM is sufficiently long, for example, longer than 1 sec at the temperature of 80° C. Therefore, the above-mentioned result of observation indicates that a value of about 0.9~2.0 of $L_n$ provides a sufficient memory holding time length. In case the channel depth D is set at 0.1 μm, the device will operate well as a dynamic RAM even when the effective channel length is in the range of 0.09 μm to 0.2 μm.

Figure 25:
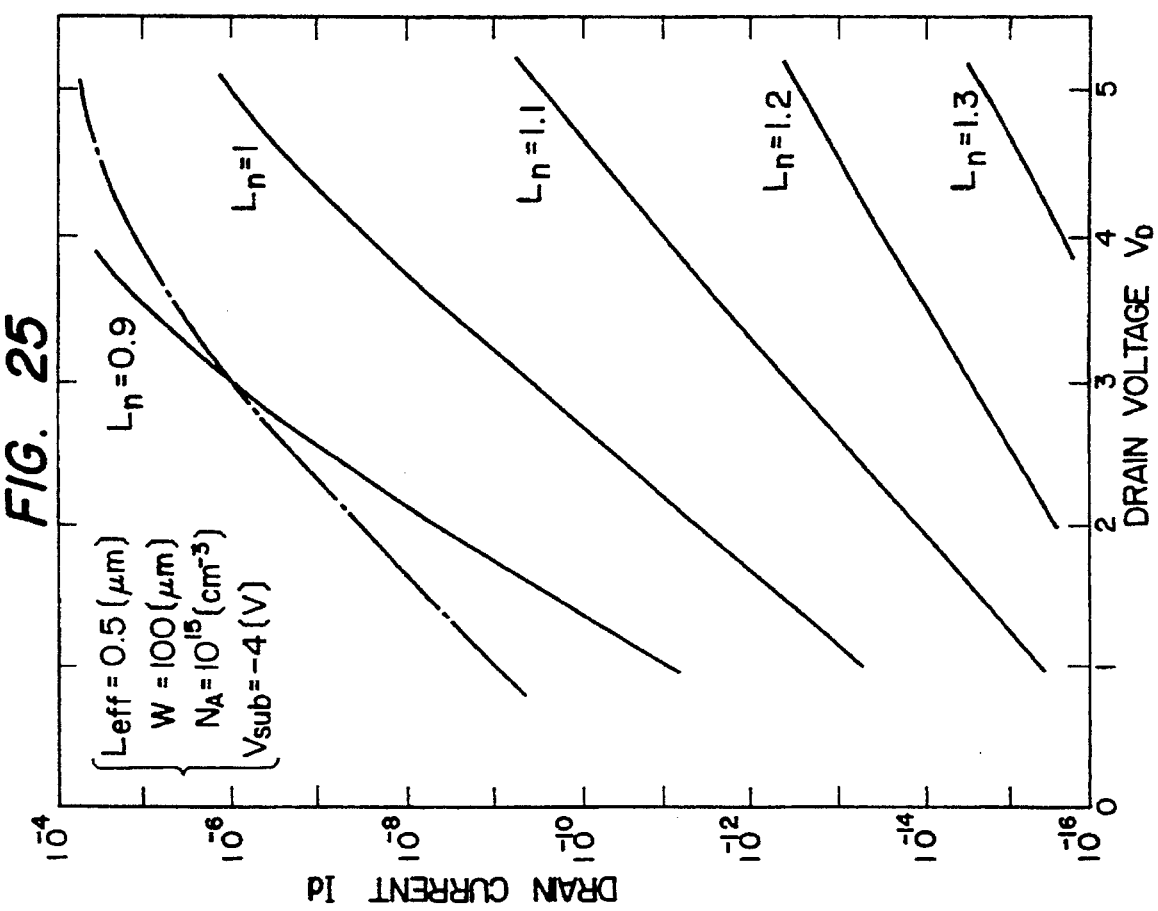
FIG. 25 is a chart for explaining the dependency characteristic of drain current upon drain voltage for various normalized channel lengths.

In FIG. 25 is shown the relationship between the drain current $I_d$ and the drain voltage $V_D$ in case the channel width W is set at 100 μm. In the Figure, one-dot-chain line indicates the experimental value of sample I ($L_{eff}=0.5$ μm). It will be noted clearly in FIG. 25 that by increasing $L_n$ to 0.9, 1.0, 1.1, 1.2 and 1.3, the drain current (sub-threshold current) decreases progressively accordingly.

Figure 26:
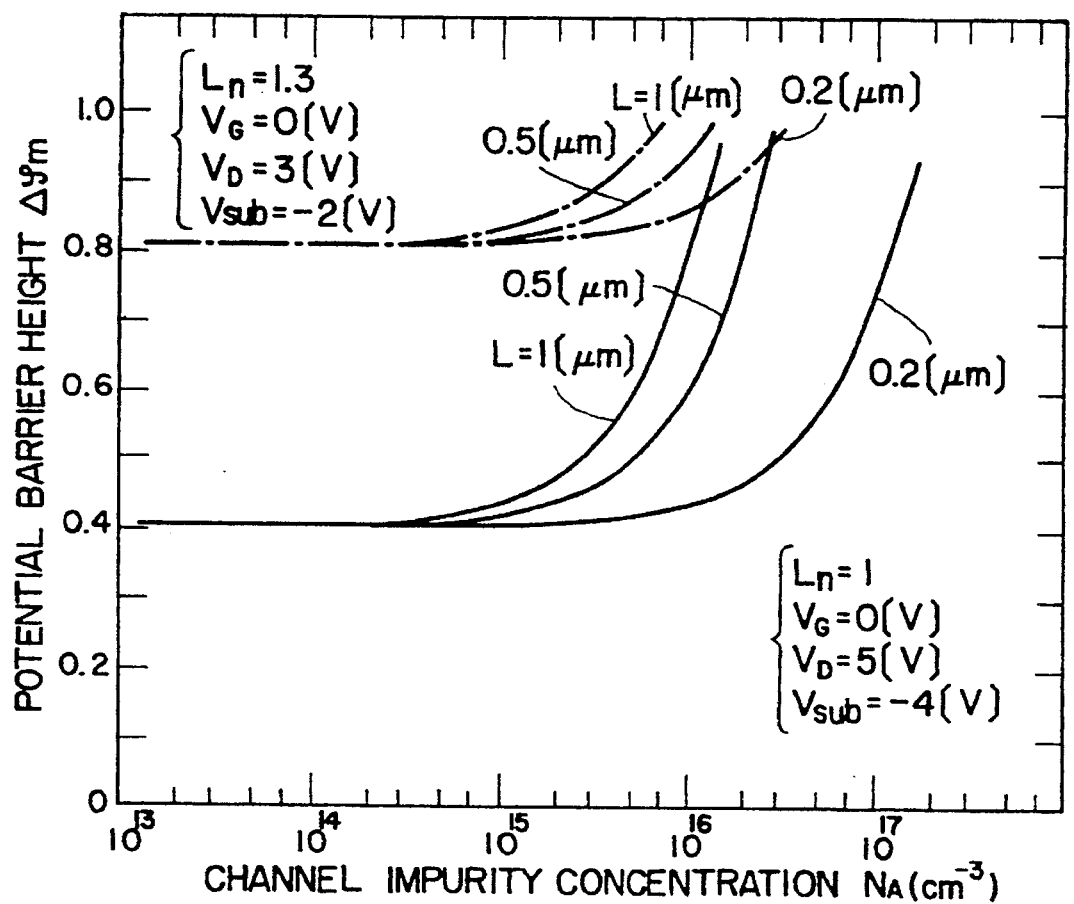
FIG. 26 is a chart for explaining the dependency characteristic of potential barrier height upon channel impurity concentration for various normalized channel lengths.

Discussions have been made under the assumption that the impurity concentration $N_A$ of the channel region is held constant for the foregoing embodiments. However, the effect of the impurity concentration $N_A$ of the channel region upon the potential barrier height $\Delta\phi_m$ is shown in FIG. 26. In this Figure, there are shown two kinds of instances. As is well known, in case the impurity concentration $N_A$ of the channel region is increased, the height of the potential barrier $\Delta\phi_m$ will increase. However, $\Delta\phi_m$ is kept substantially constant for values of $N_A$ below a certain level. The maximum value of $N_A$ below which $\Delta\phi_m$ assumes a substantially constant value will augment with shorter lengths of the channel region. Thus, so long as a required value of $\Delta\phi_m$ is guaranteed, $N_A$ is desired to have as small a value as possible. This is because of the fact that a small value of $N_A$ brings about a reduction of space charge resistance, and the profile of electric field within the channel region is uniformalized, so that the intensity of electric field decreases, resulting in a reduction of hot electron effect.

Based on the above-stated consideration, the effective channel length of those d-RAM cells having the structures shown in FIGS. 14 to 18 can be shortened up to about 0.1 μm. In case the effective channel length is shortened up to this level, the hot electron effect which acts to shift threshold voltage in a short-channel MOS transistor becomes extremely small. This is because the time required for the electrons to flow through the channel becomes shorter, so that these electrons will reach the electrode region prior to being converted to hot electrons.

In case a p⁺ type buried region 33 is provided within the channel region along therewith as shown in FIGS. 14 to 18, the response of the potential profile within the channel to the varying word line voltage becomes quick, and accordingly the operation speed of the device improves. This, of course, is required to be accompanied by the consideration not to increase the bit line capacitance.

Figure 27:
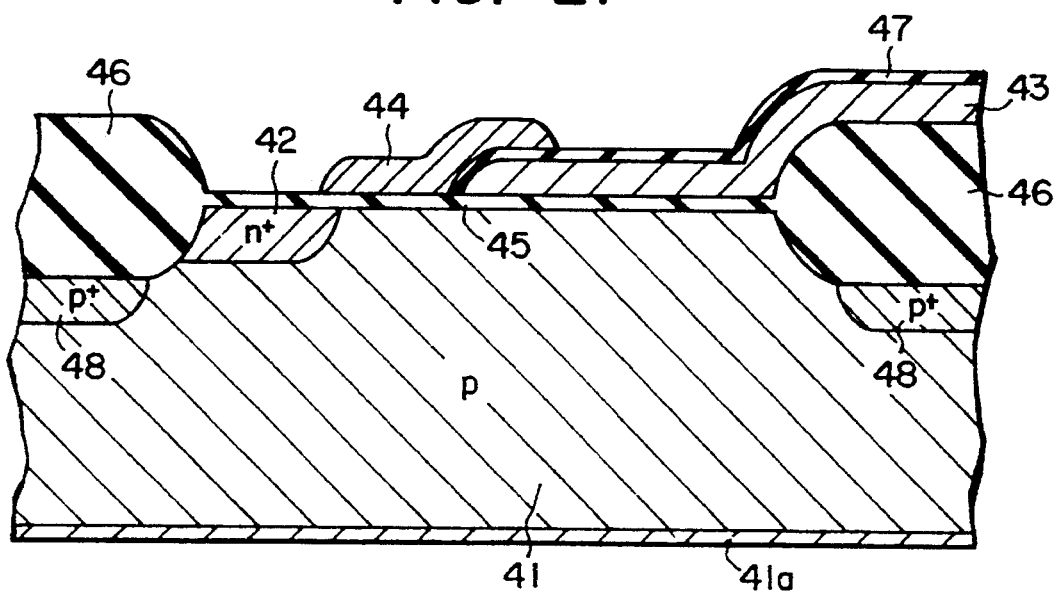
FIGS. 27 to 29 are diagrammatic sectional views, showing the structures of d-RAM cells according to embodiments of the present invention.

A concept completely the same with that discussed above can be applied to a double-layer polysilicon d-RAM cell wherein the n⁺ type region 13 is formed with an inversion layer. Such example is shown in FIG. 27. In this Figure, reference numeral 41 represents a p type substrate. An n⁺ type region 42 constitutes a bit line region. Numeral 43 represents a low resistivity polysilicon layer, 44 a p⁺ type polysilicon gate region, 45 a gate oxide film, 46 a field oxide film, 47 an oxide film, and 48 a p⁺ type channel stopper region. A storage capacitor $C_s$ is formed by 43, 45 and 41. Numeral 41a represents a substrate electrode. A signal is stored on the basis of the amount of electrons which are stored within the depletion layer which, in turn, is induced below the low resistivity polysilicon layer 43, and this layer may be called an inversion layer. However, this region will be called the drain region herein for the sake of simplicity.

Figure 28:
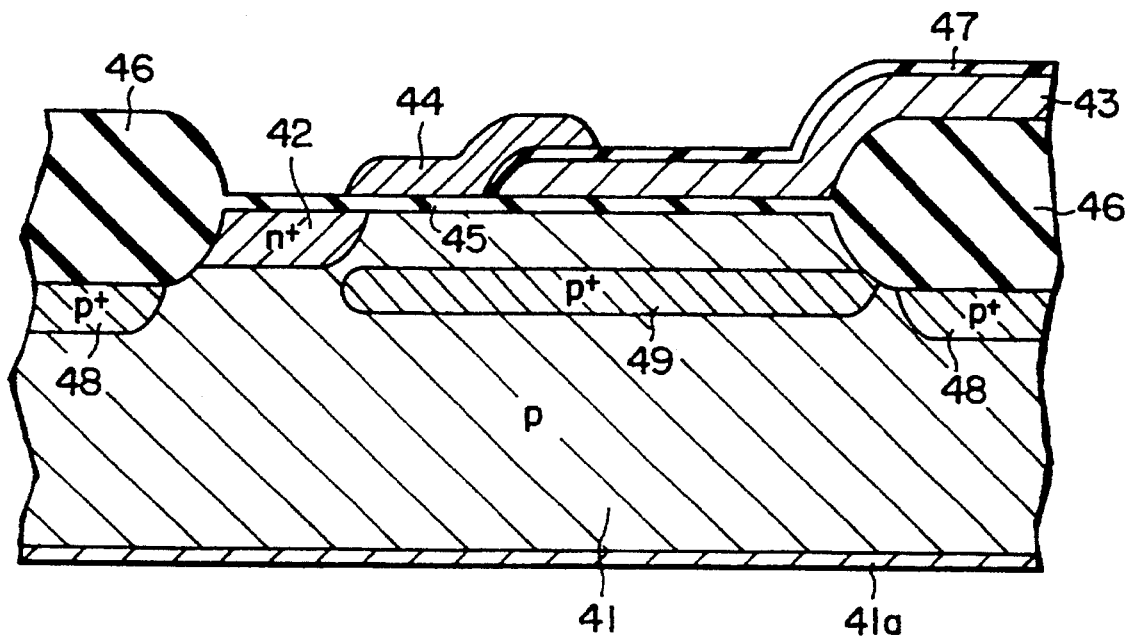
Figure 29:
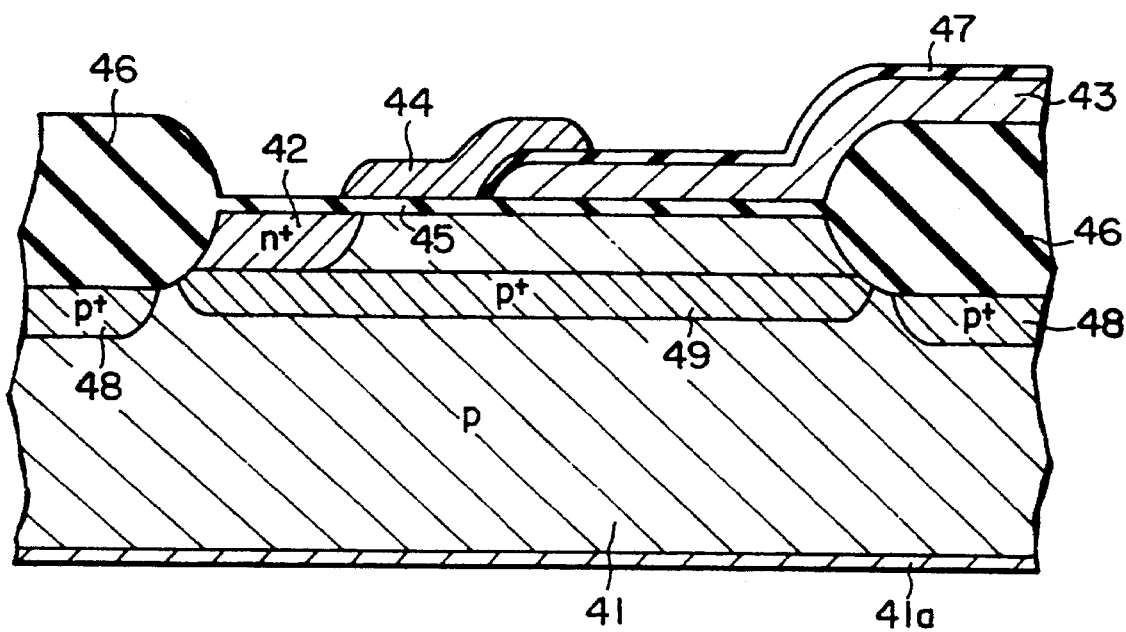

In a same manner and conception for the embodiments shown in FIGS. 14 to 18, it is also effective to provide a p⁺ type buried region or a p⁺ type substrate. For example, in FIG. 28, there is provided a p⁺ type region 49. It is needless to say that the p⁺ type buried region 49 may extent as far as that portion of the p type substrate 41 located below the n⁺ type source (bit line) region 42, as shown in FIG. 29.

It is in the d-RAM cell structure that the suppression of what is called leak current flowing across the source region and the drain region is required most severely at the zero gate bias state of the device. For this reason, description of an application of the MOS transistor according to the present invention has hereinabove been directed solely to d-RAM cell. In these preceding Figures, there have been shown only a single cell structure. In practice, however, such cell is provided at respective crossing points of a matrix which is formed by bit lines and word lines, wherein word lines are connected to a decoder and bit lines are connected to a sense amplifier.

A short channel MOS transistor structure serves to increase transconductance, and to accelerate high-speed operation in logic circuit also. The effect of leak current at turn-off time of semiconductor devices employed in the formation of logic circuitry is not so great as in d-RAM cell. However, in case leak current becomes excessively large, this will give rise to the tendency that clear differentiation between high level and low level of an output becomes difficult to be acquired. Accordingly, in a logic circuit using such MOS transistor wherein the effective channel length is set smaller than about 1 μm, it is desirable to construct a gate region having a conductivity type same as that of the channel region, even though there may be some complexity in the fabrication process. Such gate can needless to say be made with a metal having a high melting point or a metal silicide.

Figure 30:
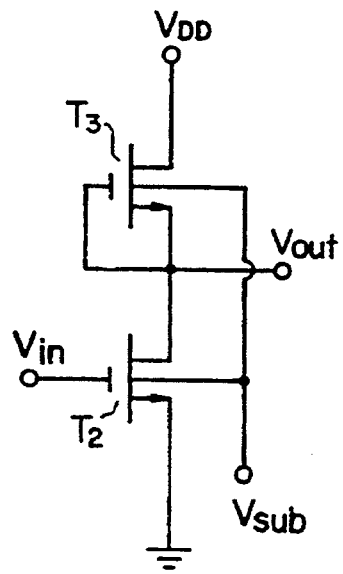
FIGS. 30 to 32 are circuit diagrams of inverters employing the MOS transistors according to the present invention.
Figure 31:
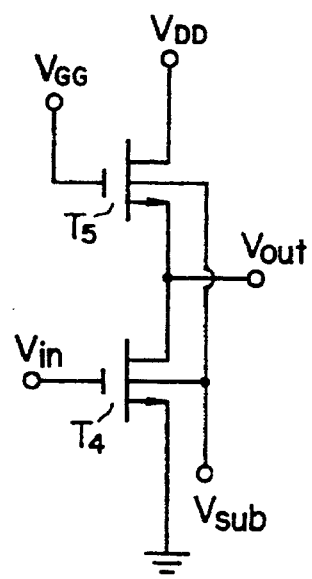
Figure 32:
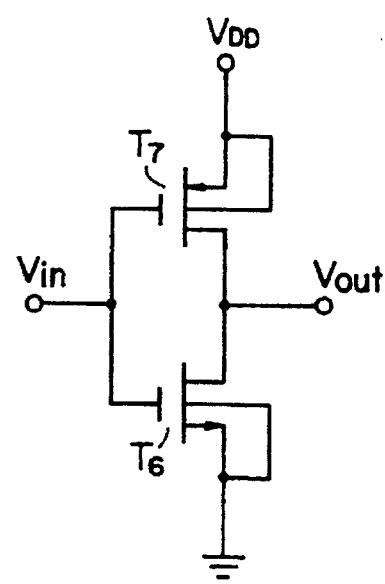

Some logic circuits embodying the above-stated principle are shown in FIGS. 30, 31 and 32.

FIG. 30 illustrates the circuit diagram of an inverter arrangement in which a load transistor is comprised of a MOS transistor $T_3$ having its gate electrode directly coupled to its source electrode. Symbol $T_2$ represents a MOS transistor embodying the present invention. Since the turn-off of this MOS transistor $T_2$ can be performed sufficiently well owing to the practically suppressed leak current, the high level output is almost perfectly close to the voltage $V_{DD}$ of power supply. It should be understood that the load transistor $T_3$ may be formed with the MOS transistor of the present invention.

FIG. 31 shows another inverter arrangement in which a constant potential $V_{GG}$ is applied to the gate electrode of a MOS transistor $T_5$. Depending on the requirement of design, the constant potential $V_{GG}$ may be directly coupled to the drain electrode of the MOS transistor $T_5$. Symbol $T_4$ represents a MOS transistor of the present invention. It should be understood here again that the transistor $T_5$ may be formed with the MOS transistor of the present invention.

FIG. 32 illustrates a circuit diagram of a complementary inverter. Symbols $T_6$ and $T_7$ represent MOS transistors of the present invention. This CMOS arrangement may be termed an ideal circuit arrangement such that a current is allowed to flow only during the switching operation, and that no current is allowed to flow during non-switching period. Besides, the MOS transistor of the present invention which has been described above is such that leak current is suppressed to a very small level. Thus, the strong point of a CMOS arrangement can be displayed prominently even in short-channel semiconductor devices and also in high packing density integrated circuits. Furthermore, a short-channel semiconductor device leads to a reduced gate capacitance, and also to a quick response of the channel potential to the gate voltages applied. Therefore, the switching speed of the device is greatly improved, and thus the advantage of a CMOS arrangement can be displayed all the more conspicuously. As described, the CMOS arrangement using the MOS transistor of the present invention is extremely excellent in its high-speed operation and low power dissipation characteristics. Based on the above-described arrangements shown in FIGS. 30, 31 and 32, there can be easily constructed multi-input NOR gate and NAND gate, and furthermore static RAM can be easily formed.

It should be understood here that the MOS transistor embodying the present invention is not limited to those arrangements described hereinabove. The respective conductivity types of the constituting semiconductor regions may be reversed. In short, it is only necessary to arrange that a highly-doped region having a conductivity type opposite to that of the source region is provided, as at least part of the gate electrode, so as to be in direct contact with the gate insulating layer or film. In case it is intended to further improve the performance, it is only necessary to provide a highly-doped region within the substrate so as to extend along the channel region. It should be noted also that in case the depth from the surface of the substrate up to the p⁺ buried region 33 (FIG. 14) is designated as D and in case the effective channel length is designated as $L_{eff}$, the device will operate sufficiently well as d-RAM even where this $L_{eff}$ is nearly in the order of about D to 1.2 D, though depending on the substrate bias voltage applied. More particularly, in case said depth D is 0.15 μm, $L_{eff}$ will be 0.15 to 0.18 μm.

The MOS transistor which has been described above is such that even in a short-channel structure having an effective channel length $L_{eff}$ of 1 μm or less, the leak current can be suppressed to a sufficiently small value. Thus, its effect or advantage is displayed very prominently especially when a d-RAM is constructed by such MOS transistor. Even when the effective channel length $L_{eff}$ is set at 0.1 to 0.5 μm, a sufficient holding of memory contents can be materialized.

Figure 33:
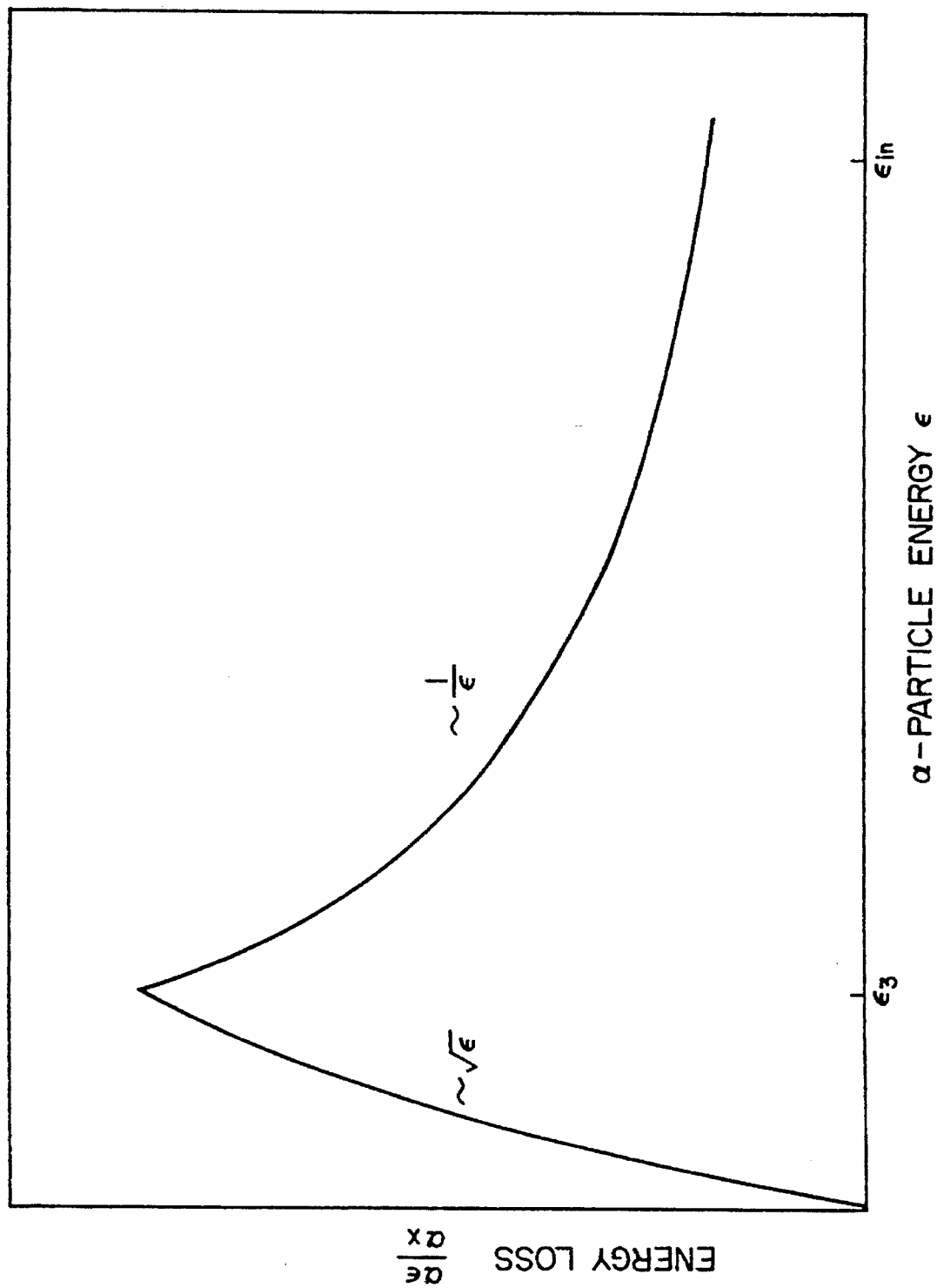
FIG. 33 is a chart for showing energy loss of alpha particle.

Now, generally speaking, in case the channel length is reduced in a MOS transistor and when, thus, the storage capacitance is reduced as discussed previously, there arises the problem that those carriers which have been created by irradiation of alpha-particle will flow into the storage region which has been rendered to a floating state, to thereby extinguish the stored electric charge or the contents of memory. In FIG. 33 are shown the energy loss characteristics of alpha-particle irradiated into a silicon semiconductor body. The vertical axis represents a loss rate of energy ϵ of alpha-particle relative to the distance x in the direction of entry of alpha-particle. The horizontal axis represents the energy of alpha-particle. In case energy ϵ of the alpha-particle is small, this alpha-particle will lose its energy mostly due to its collision with nuclei. In case the energy ϵ is great, the alpha-particle will lose its energy mostly when it collides with electrons. In case an alpha-particle is irradiated into silicon, $\epsilon_3$ will have a value of about 360 keV.

The process of loss of energy of alpha-particle due to its collision with electrons may be said to be proportional substantially to $1/\epsilon$ in a region where energy $\epsilon$ is greater than $\epsilon_3$, and to be proportional substantially to $\sqrt{\epsilon}$ in a region where $\epsilon$ is smaller than $\epsilon_3$, as:

$$-\frac{d\epsilon}{dx} = \frac{A}{\epsilon} : \epsilon > \epsilon_3, \text{ and} \quad (12)$$

$$-\frac{d\epsilon}{dx} = K\sqrt{\epsilon} : \epsilon < \epsilon_3, \quad (13)$$

wherein: A and K are constants.

The depth or range R of entry into silicon of alpha-particle having an initial energy $\epsilon_{in}$ at the time of irradiation is given by:

$$R = \frac{1}{2A}(\epsilon^2_{in} + 3\epsilon_3^3). \quad (14)$$

The density of electron-hole pairs n(x) excited by alpha-particle along its track of entry is given by:

$$n(x) = \frac{1}{\epsilon_g}\left(-\frac{d\epsilon}{dx}\right), \quad (15)$$

wherein: $\epsilon_g$ represents an energy required for creating electron-hole pairs.

From Formulas (12), (13) and (15), are yielded the following:

$$n(x) = \frac{A}{\epsilon_g \sqrt{\epsilon^2_{in} - 2Ax}} : x \leq x_3 \text{ and} \quad (16)$$

$$n(x) = \frac{1}{4\epsilon_3^3 \epsilon_g}(\epsilon^2_{in} + 3\epsilon_3^2 - 2Ax) : R \geq x > x_3, \quad (17)$$

wherein: $x_3$ represents the distance at which the energy of alpha-particle becomes $\epsilon_3$. In silicon, A=5.1×10⁵ (keV)²/μm and $\epsilon_g$=3.6 eV. Supposing that $\epsilon_{in}$ is 5 MeV, the depth of entry of alpha-particle will be 25 μm. Accordingly, alpha-particle which is irradiated with an energy of about 5 MeV will not make many electron-hole pairs at the surface of silicon semiconductor substrate, and will create a greater number of electron-hole pairs when alpha-particle has lost 90% or more of its energy. An alpha-particle is considered, in ordinary cases, to enter into silicon, by initial energy, to a depth of about 10 to 30 μm. As such, the alpha-particle will create a greater number of electron-hole pairs at a depth of entry just before it reaches the depth of 10 to 30 μm.

Figure 34:
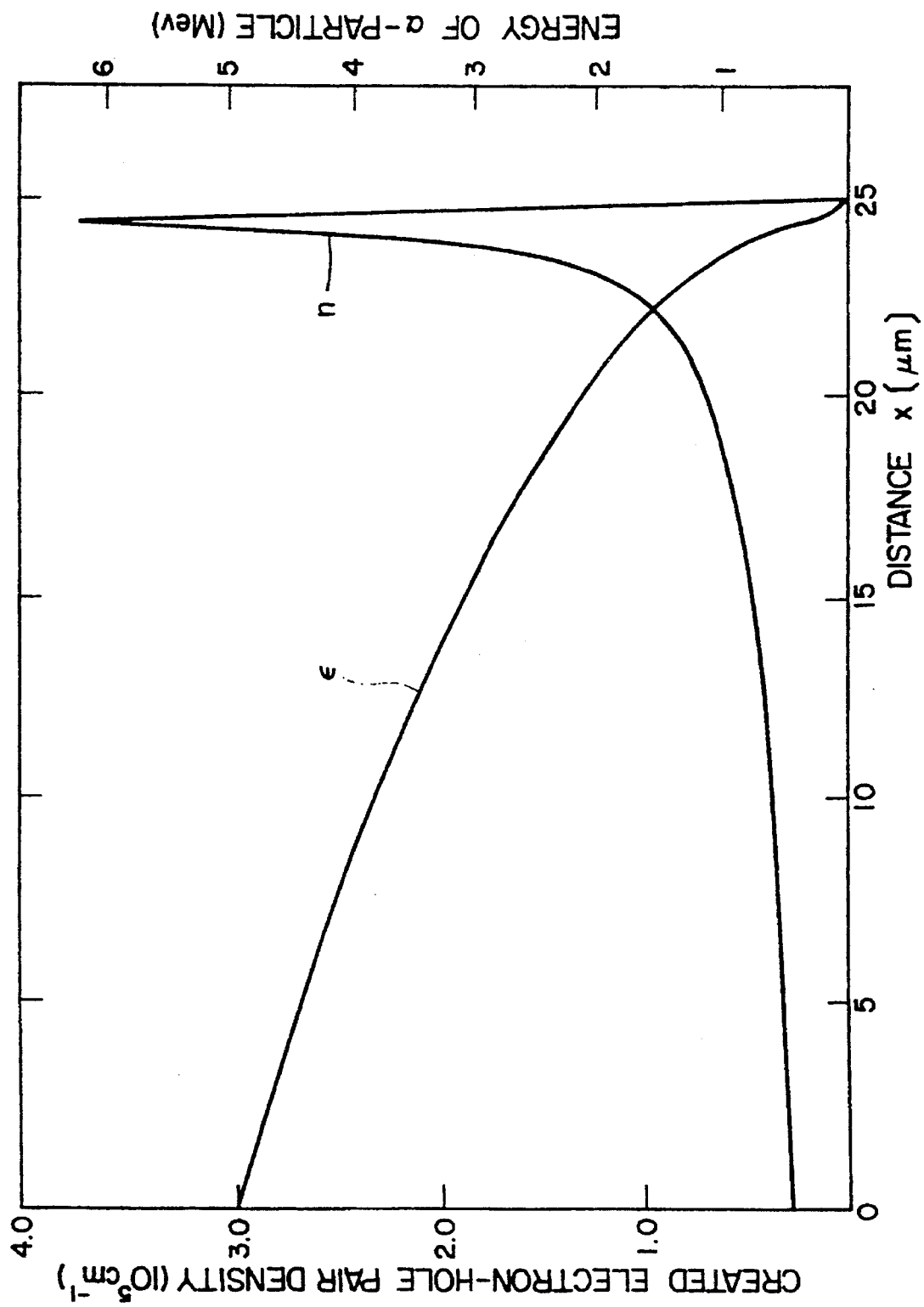
FIG. 34 is a chart for explaining the dependency characteristic of the density of electron-hole pairs which are excited by alpha particle upon the distance of entry of this alpha particle.

FIG. 34 shows variation of the energy $\epsilon$ of alpha-particle having an initial energy of 5 MeV, relative to the distance of its entry into silicon when irradiated thereinto, and also the density of electron-hole pairs created thereby.

Figure 35:
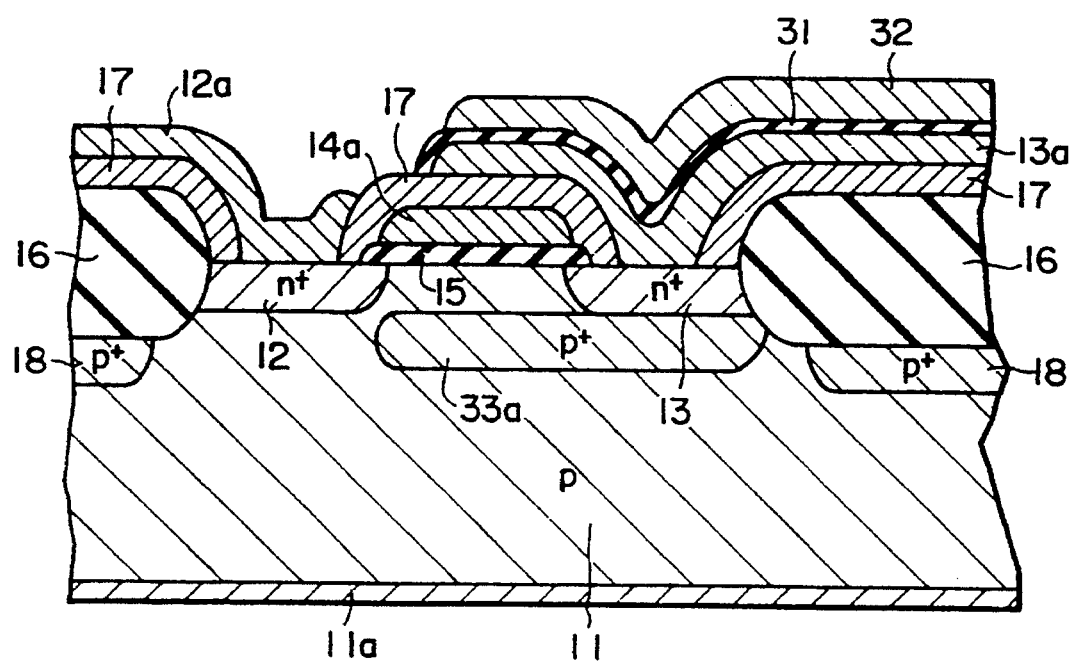
FIG. 35 is a diagrammatic sectional view, showing the structure of a d-RAM cell according to a further embodiment of the present invention.

FIG. 35 shows an example of a section of a MOS d-RAM cell which is designed so that the flow, into the storage region, of electrons or holes which are created by irradiation of alpha-particle is inhibited and that accordingly the stored electric charge is not cancelled out. In this Figure, like parts in FIG. 14 are indicated by like reference numerals and symbols. A p⁺ type buried region 33a is a region of high impurity concentration which is provided along the channel region. Numeral 11a represents a substrate electrode. This electrode 11a need not be provided on the entire rear-side surface of the substrate 11. Also, in a short-channel transistor, an n⁺ type region 12 and an n type region 13 have a depth of about 0.05 to 0.5 μm. These two regions are provided shallower as the channel length becomes shorter. The p⁺ type buried region 33a is illustrated here so that it is directly adjacent the n⁺ type region 13 which is to serve as the storage region. It should be noted, however, that said buried region 33a need not be in direct adjacent this storage region 13. The directly adjacent arrangement leads to a larger storage capacitance. In case the p⁺ type buried region 33a is located to be in direct adjacent the storage region 13 as illustrated here, it is desirable to arrange the impurity concentration of that portion of this p⁺ type buried region 33a which is directly adjacent the n⁺ type storage region 13 so as to be about 3×10¹⁷ cm⁻³ or lower. Such selection of the impurity concentration of said portion is intended to suppress the occurrence of the phenomenon that the region located between the n⁺ type region 13 and the p⁺ type buried region 33a is rendered to breakdown state by the reverse bias condition during operation and that, accordingly, a current is allowed to flow thereacross. In the case of silicon, the breakdown voltage at the junction of n⁺ p⁺ is about 12V in case the p⁺ type region has an impurity concentration of 1×10¹⁷ cm⁻³. If the write-in voltage $V_w$ is 5V and the substrate reverse bias voltage $V_{sub}$ is −5V, the breakdown voltage has to be set at least 10V. It should be understood that the impurity concentration of that portion of the p⁺ type buried region 33a located so as to be in contact with the channel region may be identical with the impurity concentration of that portion which is located directly adjacent the n⁺ type region 13, or it may be higher than that. Even where the impurity concentration of the p⁺ type region 33a is substantially uniform as portions of this region go progressively toward the p type substrate 11, there is being produced, between the p⁺ type buried region 33a and the p type substrate 11, a drift electric field due to slight difference in the degree of impurity concentration. That is, those holes located in the p⁺ type buried region 33a diffuse toward the p type substrate 11 side. Whereby, there is induced, between the p⁺ type buried region 33a and the p type substrate 11 which may have an impurity concentration of, for example 2×10¹⁵ cm⁻³ or less, an electric field extending from the p type substrate 11 toward the p⁺ type buried region 33a. Those electrons which are created by alpha-particle in the p type substrate 11 are transferred back to the p type substrate 11 side by this electric field, and thus they cannot enter into the p⁺ type buried region 33a. Therefore, these electrons, after all, will not reach the n⁺ type region 13. On the other hand, those holes which have been produced will flow into the p type substrate 11.

In order to increase the diffusion electric field or diffusion potential which is induced between the p⁺ type buried region 33a and the p type substrate 11, it is only necessary to lower the impurity concentration of the p type semiconductor substrate 11. For example, this impurity concentration is set at about 10¹⁴ to 10¹⁵ cm⁻³. It is needless to say that the level of this impurity concentration may be lower than the above-mentioned range.

However, with the device structure as described just above and shown in FIG. 35, those electrons, among the electrons which have been created by alpha-particle in the p⁺ type buried region 33a, which are located in the upper half portion of the p⁺ type buried region 33a located closer to the n⁺ type region 13, will diffuse toward that side which is contiguous with the n⁺ type region 13. This diffusion of electrons will be accelerated by a reverse bias electric field applied between the two regions 33a and 13, so that the electrons will flow into the n⁺ type region 13 and will constitute a cause of extinction of memory. In order to prevent such flow of electrons, it is only necessary to form an impurity concentration gradient in the p⁺ type buried region 33a in the direction toward the p type substrate 11. For example, the impurity concentration of that portion of the p⁺ type buried region 33a located adjacent the channel region and the n+ type region 13 is set at about $1\times10^{17}$ cm$^{-3}$, with progressively lowered concentration as the portions of the buried region 33a go progressively toward the p type substrate 11, in such manner that the impurity concentration of lowermost portion of the buried region is less than at least one third of that of the highest impurity concentration. Usually, the impurity concentration of the p type substrate 11 is about $10^{15}$ cm$^{-3}$. However, it is also effective to arrange this impurity concentration of the semiconductor substrate 11 at a low level such as about $1\times10^{15}$ cm$^{-3}$ or about $1\times10^{14}$ cm$^{-3}$, and also to arrange the impurity concentration of the channel region at a desired higher level by channel doping using ion-implantation technique. The p+ buried region, usually, is fabricated by ion-implantation.

With the device structure stated above which has an impurity concentration gradient in the p+ type buried region 33a to be progressively decreasing toward the p type substrate 11, those electrons, among the electrons created by irradiation of alpha-particle, which contribute to the extinction of memory, are only those electrons excited in the narrow region located between the p+ type buried region 33a and the surface of the semiconductor substrate. It should be understood here that in case $L_{eff}$ which is determined by the distance between the source region and the drain region is 1 μm or less, the depths of the n+ type regions 12 and 13 are about 0.3 μm or less. Also, the width of the depletion layer which grows when a reverse voltage is applied across the n+ type region 13 and the p+ type buried region 33a is about 0.3 to 0.5 μm. Accordingly, the depth of the semiconductor region which contributes to extinction of memory is no greater than just about 0.8 μm. On the other hand, the alpha-particle having an energy of several MeV will enter for a distance of about 15 to 25μm into, for example, silicon. As shown in FIG. 33, when the alpha-particle gains an energy $\epsilon_3$ of about 360 keV, it creates electron-hole pairs with highest probability. In case the alpha-particle gains an energy higher than that, the probability of generation of electron-hole pairs drops sharply. Accordingly, it will be understood that the alpha-particle immediately after irradiation to the surface of a semiconductor body has an energy of several MeV, for example about 5 MeV, and that, accordingly, the probability of creation of electron-hole pairs is extremely low near the surface. The alpha-particle will begin to create electron-hole pairs after it has entered into the semiconductor substrate to a certain distance. The number of electron-hole pairs which are created in that portion of semiconductor region up to a depth of about 0.8 μm from the surface of the semiconductor body is about 1/50 or less of the total number (which is of the order of $10^6$) of those electron-hole pairs which are created in the semiconductor body by a single alpha-particle, where alpha-particle is irradiated in a vertical direction. In other words, several ten thousand electrons will flow into the n+ type region 13. In case the storage capacitance $C_s$=0.12 pF and the stored voltage $V_m$=5V, the number of those electrons which are stored in the n+ type region 13 or which are in short of electrons is about $3\times10^6$. Thus, the amount of those electrons which flow there into by the irradiation of a single alpha-particle will be smaller by two orders of magnitude than the abovesaid number. Thus, the memory cell embodying the structure of the present invention will not exhibit soft errors due to alpha-particle even where the cell area is reduced by about another one order of magnitude.

Figure 36:
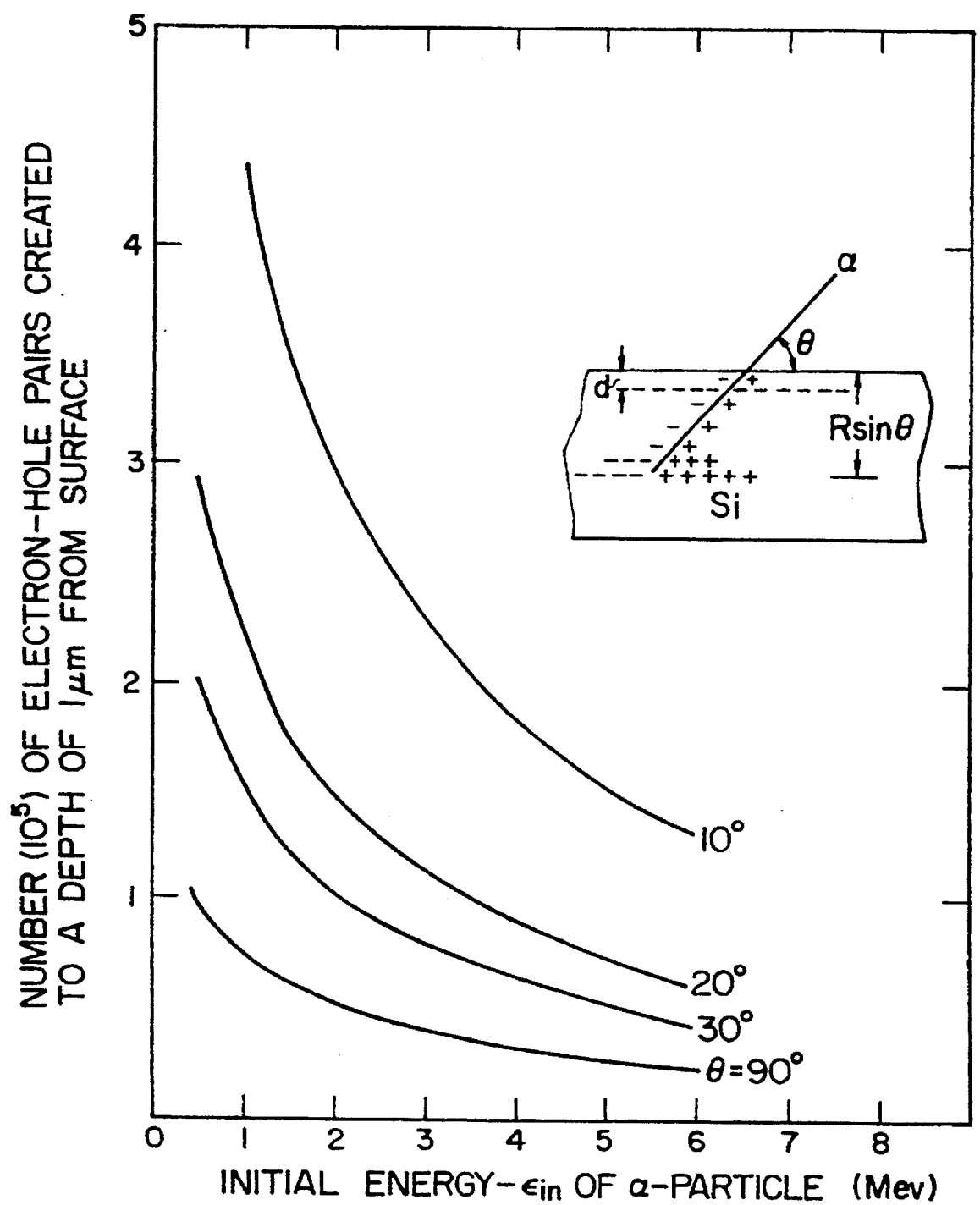
FIG. 36 is a chart for explaining the dependency characteristic of the density of electron-hole pairs which are excited by alpha particle up to a depth of 1 μm from surface, upon the initial energy of this alpha particle.

Description has been made in the above of instances where alpha-particle is irradiated normally or vertically onto the surface of silicon substrate. However, in case alpha-particle is irradiated with an inclination there-onto, the situation will become different. For example, in case an alpha-particle having an initial energy of 5 MeV impinges onto the surface of a silicon semiconductor body at an angle of incidence of 30°, this alpha-particle will enter into silicon up to a depth of 25 μm. However, the depth measured from the topmost surface of the device is 12.5 μm. Also, as the initial energy of alpha-particle attenuates, the site at which electron-hole pairs are created in a large number will shift toward and closer to the surface of the device. Based on the foregoing considerations, there is shown in FIG. 36, as the function of the initial energy $\epsilon_{in}$, the total number of electron-hole pairs which are created in that portion of the semiconductor body from the surface of the device up to a depth of 1 μm, which depth substantially influencing the memory-storing action of the memory cell. As a matter of course, as the value of $\epsilon_{in}$ becomes smaller, the total number of the electron-hole pairs created at a depth within 1 μm by alpha-particle will become larger. Also, as the angle of incidence θ of alpha-particle becomes smaller, the total number will increase. Usually, the angle of incidence of alpha-particle irradiated from a package is considered to be 30° or greater, and the minimum energy of alpha-particle is about 1 MeV. The number of electron-hole pairs, when θ=30° and when $\epsilon_{in}$=1 MeV, is about $1.5\times10^5$. When the storage capacitance $C_s$=0.1 pF and when the stored voltage $V_m$=3V, the stored electric charge $Q=C_s\cdot V_m=3\times10^{-}$C. The number of corresponding electrons is $1.9\times10^6$. That is, the amount of electrons created which adversely affect the memory action is no greater than only 10% of the stored electric charge, and thus it can be disregarded.

In FIG. 35, the p+ type buried region 33a is not provided below the n+ type region 12 side which serves as the bit line. This p+ type buried region 33a may be provided so as to extend up to below the n+ type region 12 as in the instance of FIG. 16. By so arranging, it is possible to eliminate the adverse effect caused by those electrons excited by alpha-particle in the bit line at the time of read-out operation. Such arrangement, however, has the disadvantage that the bit line capacitance becomes increased. Therefore, in such case, it is effective to form the n+ type region 12 shallow so as to position this region apart from the p+ type buried region 33a.

Figure 37:
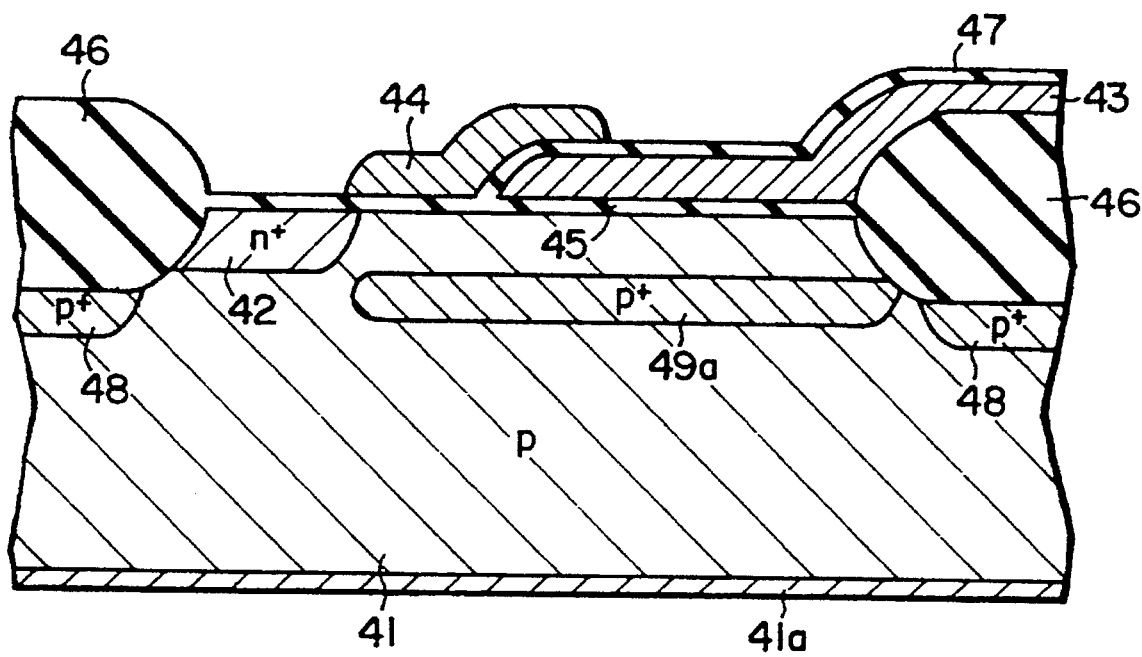
FIG. 37 is a diagrammatic sectional view, showing the structure of d-RAM cell according to another embodiment of the present invention.

Now, FIG. 37 shows a sectional structure of a memory cell according to the present invention wherein a region corresponding to the n+ type region 13 shown in FIG. 35 is formed by an inversion layer. Like parts in FIG. 28 are indicated by like reference numerals and symbols, and their explanation is omitted. The p+ type buried region 49 in FIG. 37 is provided with an impurity concentration gradient toward the p type semiconductor substrate 41 in the same manner as that of the embodiment shown in FIG. 35. However, unlike the p+ type buried region 33a shown in FIG. 35, there is almost no need to consider reverse bias voltage of the p+ type buried region 49. Therefore, there is no need to limit the impurity concentration of that portion of this region located close to the surface thereof to about $1\times10^{17}$ cm$^{-3}$. The impurity concentration of that portion may be higher than the above-mentioned level.

Figures 38, 39:
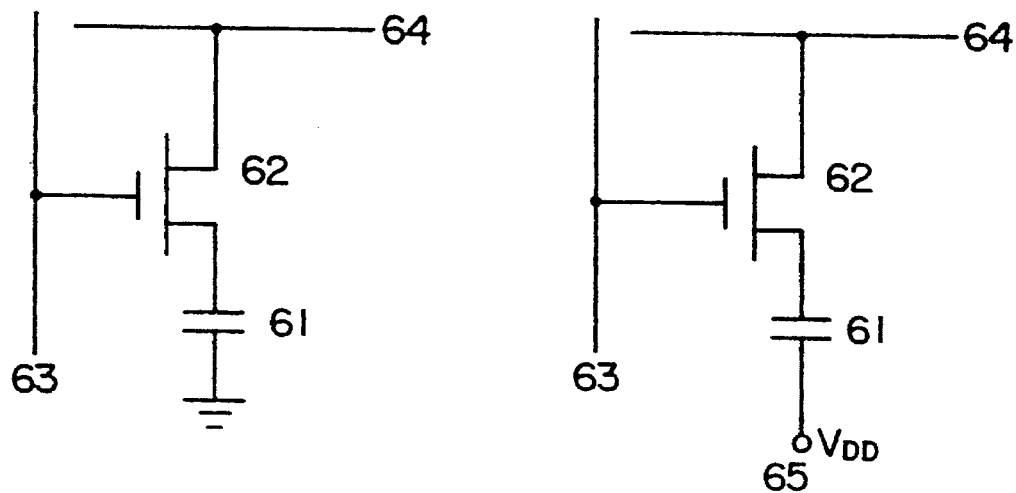
FIGS. 38 and 39 are circuit diagrams of d-RAM cell according to the present invention.

In the embodiment shown in FIG. 35, there is provided an n+ type region 13. Therefore, the abovesaid embodiment is able to perform not only the electron-depletion storing mode operation as shown in FIG. 38, but also the electron-accumulation storing mode operation as shown in FIG. 39. It should be noted, however, that with the structure shown in FIG. 37, it is only possible to operate the electron-accumulation storing mode operation as shown in FIG. 39.

In FIGS. 38 and 39, numeral 61 represents a word line, and 64 a bit line. In the embodiment of FIG. 38, a terminal of the storage capacitor 64 is grounded. In the embodiment of FIG. 39, however, this terminal is connected to a positive power supply $V_{DD}$ 65. In the embodiment of FIG. 38, a write-in voltage $V_w$ (in case of an n-channel MOS transistor, it is a positive voltage) is applied to the bit line 64, and a voltage is applied to the word line 63, and thus the MOS transistor 62 is rendered conductive to thereby allow electrons to flow out from the n⁺ type region 13 which serves as the storage region, to cause this n⁺ type region 13 to be positively charged up. Thereafter, the voltage on the word line 64 is removed to effect a memorizing operation. In such instance, the n⁺ type region 13 becomes in short of electrons, and it is positively charged. Therefore, this region 13 is reversely biased relative to its surrounding p type region including the p⁺ type region. Thus, memory contents are retained well.

In the operating state of the device shown in FIG. 39, a positive voltage $V_{DD}$ is always applied to a terminal of the storage capacitor 61. Accordingly, in the normal state, an excessive amount of electrons is stored in the n⁺ type region 13. During the write-in operation, however, the number of the excessive electrons is reduced. In case the write-in voltage is equal to the power supply voltage $V_{DD}$, the excessive electrons in the n⁺ type region 13 will almost disappear upon application of the write-in voltage $V_w$.

It should be understood that the device structures according to the present invention are not limited to those shown in FIGS. 13 to 18, 27, 28, 29, 35 and 37. Constitutional regions of devices may have reverse conductivity types. Although such structures will exhibit lower-speed operation, they can provide similar operation if the polarity of voltages applied is reversed accordingly.

Description has been made of those embodiments wherein the channel stopper region is separated away from the buried region. It should be understood, however, that these two regions may be arranged to be in contact with each other.

Embodiments of d-RAM cell due to the present invention have a storage capacitor which includes a thin insulator layer. In these embodiments, said thin insulator layer is comprised of an oxide layer. It should be understood, however, that this thin insulator layer consists of other insulator material such as silicon nitride ($Si_3N_4$) or tantalum oxide ($Ta_2O_5$). These materials have a dielectric constant larger than that of silicon dioxide ($SiO_2$), such as about 8 ($Si_3N_4$) and 22 ($Si_3N_4$) so that these materials are more suitable for increasing the storage capacitance.

Embodiments have been illustrated for those instances wherein components are provided on a flat surface of a semiconductor body. It is needless to say that the device may have either a V-MOS structure or a U-MOS structure.

Also, there have been shown memory cells. Such memory cells may be provided at respective cross points of a matrix formed by word lines and bit lines, and the word lines are coupled to a decoder, and the bit lines are connected to a sense amplifier, whereby a semiconductor memory is provided.

Description has been made of devices using a silicon substrate. It should be understood, however, that the substrate may be made of GaAs. Similar functions can be obtained from devices having GaAs substrate.

The structures embodying the present invention can be fabricated by relying on known oxidation technique, CVD technique, diffusion technique, ion-implantation technique, evaporation-deposition technique, wiring technique, wet-dry etching technique and like techniques.

What is claimed is:

1. A dynamic random access memory comprising at least one insulated gate transistor and one storage capacitor, wherein:

said transistor comprises:

an insulated-gate transistor having a semiconductor substrate, and having, closer to a surface of said substrate, a source semiconductor region of one conductivity type and a low resistivity, a drain region having said one conductivity type and a low resistivity and a channel semiconductor region of the opposite conductivity type and a high resistivity defined between said source region and drain region, and having a gate electrode formed on a surface of said channel region via a gate insulator layer, characterized in that (a) said semiconductor substrate has a high impurity concentration and has a conductivity type opposite to that of said source region;

(b) said semiconductor device further includes, at a surface of said substrate, a region of a lesser impurity concentration than that of said substrate and of a conductivity type being the same as that of said substrate thereby to define an implanted region of higher doping concentration that is positioned lower than and effectively separated from the source region and that does not appreciably increase junction capacitance between said defined implanted region and the source region;

(c) said source region, said drain region and said channel region are formed in said region of a lesser impurity concentration;

(d) at least a portion of said gate electrode contacting said gate insulator layer is formed with a material which has a relatively high built-in voltage relative to said source region (12) and which is a metal, a metal silicide, or a highly-doped polysilicon of a conductivity type opposite to that of said source region;

(e) an effective channel length of less than 1 µm is defined by the distance between said source and said drain regions;

(f) said gate insulator layer is less than 500Å, and (g) the relationship L/D>0.9, where L represents the channel length and D represents the depth from the surface to said semiconductor substrate.

2. A semiconductor device according to claim 1 characterized in that the gate electrode is formed on the drain region via a thin insulator layer so that a storage capacitor is formed by this insulator layer, the drain region and the electrode.

3. A semiconductor device having a complementary inverter circuit comprising an n-channel insulated-gate transistor and a p-channel insulated-gate transistor connected in series to said n-channel insulated-gate transistor, gates of these transistors being directly connected to each other, wherein:

each of these transistors has a semiconductor substrate, and having, closer to a surface of said substrate, a source semiconductor region of one conductivity type and a low resistivity, a drain region having said one conductivity type and a low resistivity and a channel semiconductor region of the opposite conductivity type and a high resistivity defined between said source region and drain region, and having a gate electrode formed on a surface of said channel region via a gate insulator layer, characterized in that (a) said semiconductor substrate has a high impurity concentration and has a conductivity type opposite to that of said source regions;

(b) said semiconductor device further includes, at a surface of said substrate, a region of a lesser impurity concentration than that of said substrate and of a conductivity type being the same as that of said substrate thereby to define an implanted region of higher doping concentration that is positioned lower than and effectively separated from the source region and that does not appreciably increase junction capacitance between said defined implanted region and the source region;

(c) said source region, said drain region and said channel region are formed in said region of a lesser concentration;

(d) at least a portion of said gate electrode contacting said gate insulator layer is formed with a material which has a relatively high built-in voltage relative to said source region (12) and which is a metal, a metal silicide, or a highly-doped polysilicon of a conductivity type opposite to that of said source region;

(e) an effective channel-length of less than 1 μm is defined by the distance between said source and said drain regions;

(f) said gate insulator layer is less than 500Å, and (g) the relationship L/D>0.9, where L represents the effective channel length and D represents the depth from the surface to said semiconductor substrate.

4. An MOS device comprising:

A. a substrate having a surface,

B. a low-resistive source region having a first conductivity type located on the surface of said substrate, C. a low-resistive drain region having said first conductivity type located in said substrate, D. a high-resistive channel region having a second conductivity type located between said source and drain regions, said channel region having an effective length of less than 1 μm across which current flows between said source and drain regions, E. a highly-doped polysilicon gate electrode of said second conductivity type including a gate insulator of less than 500Å located on the surface of the substrate for controlling current between said source and drain regions, said polysilicon gate electrode having a relatively high built-in voltage relative to said source region, F. a deeply implanted semiconductive region of said second conductivity type having an impurity concentration higher than said channel region and extending along at least a portion of said effective channel length L, said implanted region being effectively separated from the source region and located at a depth D sufficiently beneath the surface of said substrate so as to reduce the junction capacitance between the implanted region and the source region, and G. said channel region being configured such that the ratio L/D is greater than 0.9.

5. An MOS device as recited in claim 4 wherein said deeply implanted region comprises a buried p+ region.

6. An MOS device as recited in claim 5 wherein the buried p+ region lies at a depth lower than said source and drain regions and being effectively separated from said source region so as to reduce junction capacitance at the junction between the source and buried p+ regions.

7. A one-transistor memory device including an MOS device as recited in claim 6 for controlling access to data contained in said memory device.

* * * * *

UNITED STATES PATENT AND TRADEMARK OFFICE
CERTIFICATE OF CORRECTION

PATENT NO. : 5,552,623
DATED : September 3, 1996
INVENTOR(S) : NISHIZAWA et al

It is certified that error appears in the above-indentified patent and that said Letters Patent is hereby corrected as shown below:

ON THE TITLE PAGE:

Please change:

Item "[73] Assignee: Handotai Kenkyu Shinkokai, Sendai, Japan"

to

—[73] Assignee: ZAIDAN HOJIN HANDOTAI KENKYU SHINKOKAI, Sendai-shi, Japan—

Signed and Sealed this

Second Day of September, 1997

Attest:

BRUCE LEHMAN

Attesting Officer

Commissioner of Patents and Trademarks